United States Patent
Shima et al.

(10) Patent No.: US 8,169,819 B2
(45) Date of Patent: May 1, 2012

(54) SEMICONDUCTOR STORAGE DEVICE

(75) Inventors: Akio Shima, Hino (JP); Yoshitaka Sasago, Tachikawa (JP); Masaharu Kinoshita, Kokubunji (JP); Toshiyuki Mine, Fussa (JP); Norikatsu Takaura, Tokyo (JP); Takahiro Morikawa, Hachioji (JP); Kenzo Kurotsuchi, Kodaira (JP); Satoru Hanzawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 286 days.

(21) Appl. No.: 12/688,886

(22) Filed: Jan. 17, 2010

(65) Prior Publication Data
US 2010/0182828 A1 Jul. 22, 2010

(30) Foreign Application Priority Data

Jan. 19, 2009 (JP) ................................. 2009-008861

(51) Int. Cl.
*G11C 11/00* (2006.01)
*H01L 29/80* (2006.01)
(52) U.S. Cl. . 365/163; 365/148; 257/278; 257/E21.614; 257/E27.026
(58) Field of Classification Search .................... 365/163
See application file for complete search history.

(56) References Cited

U.S. PATENT DOCUMENTS

| | | | |
|---|---|---|---|
| 7,751,235 B2 * | 7/2010 | Hosotani et al. | 365/173 |
| 2003/0067013 A1 | 4/2003 | Ichihara et al. | |
| 2006/0050546 A1 * | 3/2006 | Roehr | 365/148 |
| 2007/0121369 A1 * | 5/2007 | Happ | 365/148 |
| 2007/0236979 A1 * | 10/2007 | Takashima | 365/145 |
| 2008/0149913 A1 | 6/2008 | Tanaka et al. | |
| 2010/0219392 A1 * | 9/2010 | Awaya et al. | 257/3 |
| 2011/0122676 A1 * | 5/2011 | Murooka et al. | 365/148 |
| 2011/0141794 A1 * | 6/2011 | Kurosawa et al. | 365/148 |

FOREIGN PATENT DOCUMENTS

JP 2003-100085 A 4/2003

* cited by examiner

*Primary Examiner* — Son Mai
(74) *Attorney, Agent, or Firm* — Miles & Stockbridge P.C.

(57) ABSTRACT

There is provided a semiconductor storage device which is capable of further reducing a size of a memory cell, and increasing a storage capacity. Plural memory cells each including a transistor formed on a semiconductor substrate, and a variable resistive device having a resistance value changed by voltage supply and connected between source and drain terminals of the transistor are arranged longitudinally and in an array to configure a three-dimensional memory cell array. A memory cell structure has a double channel structure in which an inside of a switching transistor is filled with a variable resistance element, particularly, a phase change material. The switching transistor is turned off by application of a voltage to increase a channel resistance so that a current flows in the internal phase change material to operate the memory.

12 Claims, 29 Drawing Sheets

Vh:Tr.ON    Vl:Tr.OFF

SEMICONDUCTOR STORAGE DEVICE

CLAIM OF PRIORITY

The present application claims priority from Japanese patent application JP 2009-008861 filed on Jan. 19, 2009, the content of which is hereby incorporated by reference into this application.

BACKGROUND OF THE INVENTION

1. Field of the Invention

The present invention relates to a semiconductor storage device, and more particularly to an electrically rewritable phase-change large capacity memory device that nonvolatilely stores a resistance value determined according to a phase change between a crystal state and an amorphous state of a metal compound.

2. Description of the Related Art

One type of nonvolatile storage devices uses the crystal state and the amorphous state of the metal compound as storage information. The storage material as generally used is tellurium compound. A principle in which information is stored by a difference in reflectivity between those states has been widely used in an optical information storage medium such as a DVD (digital versatile disk).

In recent years, there has been proposed that the above principle is also used in electrical information storage. This is a method of detecting a difference in electric resistance between the amorphous material and the crystal, that is, a high resistive state of amorphous material and a low resistive state of crystal according to the amount of current or a change in voltage, differently from an optical technique. This is called "phase change memory", and, for example, disclosed in Japanese Patent Application Laid-Open Publication No. 2003-100085 as a related art document. The present invention relates to the storage of electric information.

FIG. 1 shows a structure of a basic memory cell in a conventional phase change memory. In the structure, a storage element 001 (phase change material) is combined with a selective device 002. In the phase change memory, a current is supplied to the storage element 001 from the selective device 002 through a contact plug 003 to generate Joule heat 004 in the storage element 001. The Joule heat 004 puts the storage element 001 into a crystal state or an amorphous state to store and retain information. The rewrite of the phase change memory is performed by, when the storage element 001 is put into an electrically high resistive amorphous state, rapidly cooling the storage element 001 after a temperature of the storage element 001 becomes equal to or higher than a melting point thereof by supply of a large current. When the storage element 001 is put into an electrically low resistive crystal state, the rewrite of the phase change memory is performed by setting the temperature of the storage element 001 to a crystallization temperature lower than the melting temperature by limiting a current to be supplied. In general, the resistance value of the storage element is changed by double digits to triple digits according to the phase change. For that reason, the phase change memory is largely different in a read signal between the crystal state and the amorphous state to ease sense operation.

On the other hand, when data is read from the phase change memory element, for example, switching transistors are connected in series to the phase change memory element, and only a switching transistor connected to a selected read word line 005 turns on to form a current pathway. As a result, because a current flows in only the selected phase change memory, data can be read from the phase change memory. However, since one switching transistor exists in each cell, it is apparent that the cell area becomes larger.

SUMMARY OF THE INVENTION

As described above, when data is read from the phase change memory element, for example, a switching transistor connected in series to the phase change memory element is required. However, because one switching transistor exists in each cell, there arises such a problem that the cell area increases.

Under the above circumstance, an object of the present invention is to provide a semiconductor storage device which is capable of further reducing a size of the memory cell, and increasing the storage capacity.

In order to achieve the above object, a nonvolatile semiconductor storage device according to the present invention has the following characteristic configuration. That is, the nonvolatile semiconductor storage device according to the present invention is characterized in that plural memory cells each including a transistor formed on a semiconductor substrate, and a variable resistive device having a resistance value changed by voltage supply and connected between source and drain terminals of the transistor are arranged longitudinally and in an array.

As shown in FIGS. 2A and 2B, the nonvolatile semiconductor storage device according to the present invention is characterized by a memory cell structure which is a double channel structure in which an inside of a switching transistor having a gate electrode 006, a gate insulator 007, and a channel 008 is filled with a variable resistive device 009, particularly, a phase change material. FIG. 3 shows the operational principle. The switching transistor is turned off by application of a voltage to increase a channel resistance so that no current flows in the transistor. As a result, a current flows in the internal phase change material to operate the memory.

Because a current flows in the phase change material by applying a voltage to operate the memory, a configuration of the transistor that is normally on, that is, in an on-state when no voltage is applied to the transistor, and a current flows in the transistor is preferable. Because a current flows in the entire phase change material to conduct a phase change, the stable phase change can be performed. The phase change capacity can be also increased as compared with the conventional system in which a current is allowed to flow from the contact plug of the switching transistor.

According to a first characteristic configuration of the above-mentioned nonvolatile semiconductor storage device, when the transistor in each cell turns off, and a given voltage is applied between both ends of the memory cell, a change in a read current according to a resistance value of the variable resistive device is identified, thereby enabling data stored in the variable resistance element as a storage carrier to be read. Also, when the transistor turns on, the current flowing in the transistor becomes dominant, and the subject memory cell is put into a nonselective state where data is not read from the subject memory cell, which is distinguishable from a selective memory cell whose transistor is off. Further, in the write or erase operation, the transistor in the memory cell to be written and erased turns off, and a voltage value and polarity applied between both ends of the memory cell are adjusted as with the read operation, thereby enabling the resistance value of the variable resistive device to be changed. Also, data can be stored (written and erased) in the variable resistive device as a storage carrier.

When the transistor in the nonselective memory is turned on as with the read operation, a write or erase voltage to be applied between both ends of the variable resistive device is not applied by the transistor of the on-state. As a result, storage (write and erase) of data can be selectively inhibited. That is, the amplitude and pulse width of a voltage pulse applied between both ends of the memory cell as the variable resistive device are appropriately adjusted, and a high-speed writable and erasable material is selected, thereby enabling the high-speed write and erase to be realized. In addition, there can be provided the nonvolatile semiconductor storage device with high reliability without need for allowing a large current to flow during write/erase operation. FIGS. 4 and 5 are circuit diagrams showing the configuration of a nonvolatile semiconductor storage device according to an embodiment of the present invention. FIGS. 4 and 5 are circuit diagrams showing a case in which plural memory cell arrays is arranged three-dimensionally vertically and in an array, respectively.

According to an aspect of the present invention, there can be provided the semiconductor storage device that is capable of further reducing the size of the memory cells, and increasing the storage capacity.

DETAILED DESCRIPTION OF THE PREFERRED EMBODIMENTS

Figure 1:
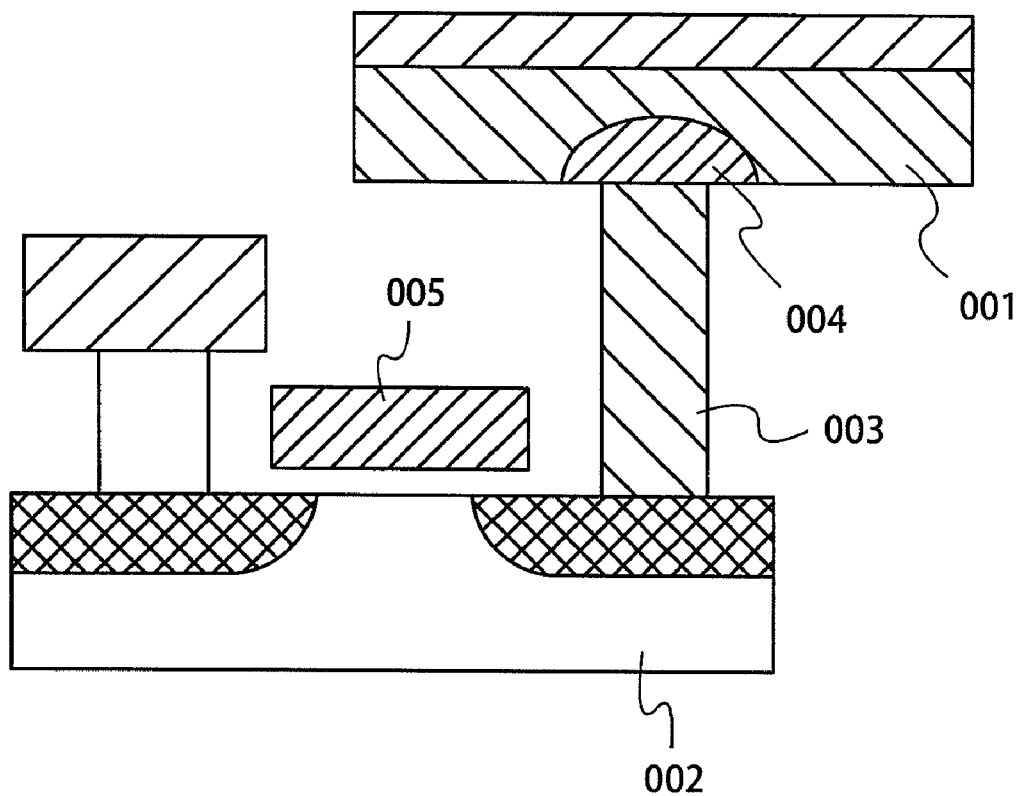
FIG. 1 is a cross-sectional view showing a main portion of a conventional nonvolatile semiconductor storage device.

Hereinafter, an embodiment of the present invention will be described in detail with reference to the accompanying drawings. In all of the drawings for description of the embodiment, the same parts are denoted by identical symbols in principle, and their repetitive description will be omitted. Also, in the following embodiment, the same or like parts will not be repetitively described in principle except as needed.

In the drawings showing the embodiment, cross-sectional views may not be hatched for making the drawings more visible. Also, plan views may be hatched for making the drawings more visible.

EMBODIMENT

A method of manufacturing a phase change memory according to an embodiment will be described with reference to the accompanying drawings.

Figure 6:
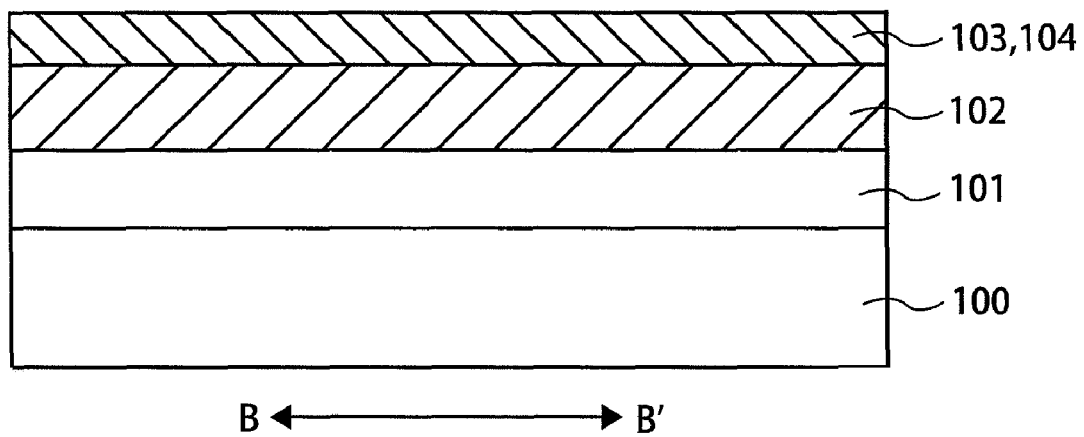
FIG. 6 is a cross-sectional view showing a partial process of manufacturing a semiconductor device according to an embodiment.
Figure 7:
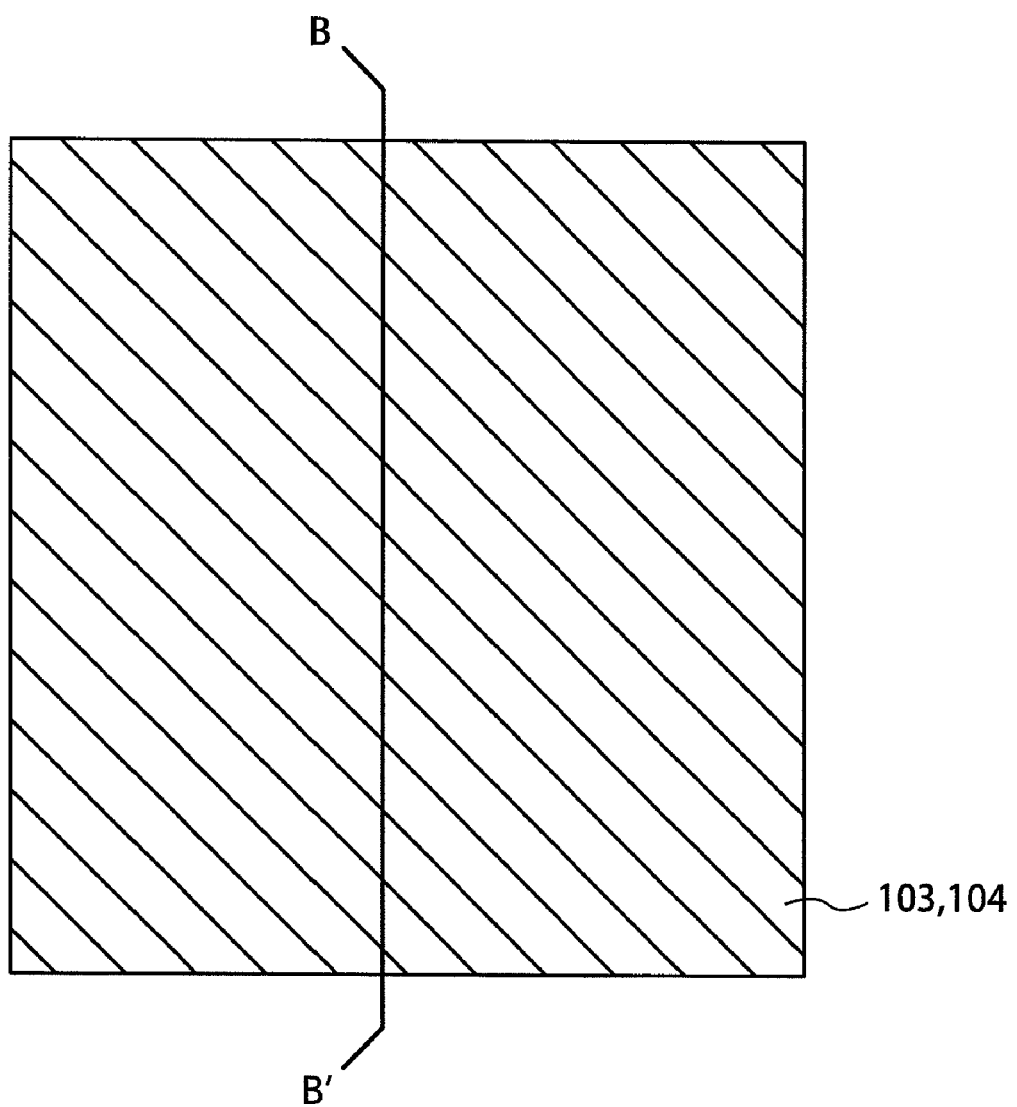
FIG. 7 is a top view showing the partial process of manufacturing the semiconductor device according to the embodiment.

FIG. 6 shows a cross-sectional view of a memory matrix in which a dopant diffusion layer 101 functioning as a contact layer on a substrate side of a memory cell is formed on a semiconductor substrate 100 including a peripheral circuit, and a first interlayer film 102 and a first polysilicon layer 103 are deposited on the dopant diffusion layer 101 in the stated order. FIG. 7 shows a top view of the memory matrix.

FIG. 6 is the cross-sectional view taken along a line B-B' in FIG. 7. The diffusion layer 101 is formed through a known technique such as ion implantation with phosphorus or arsenic as dopant. The diffusion layer 101 may be patterned as a bit line pattern which will be described later, to conduct the operation of selecting a memory cell block. The first interlayer film 102 is made of, for example, oxide film $SiO_2$, and formed through a known technique such as an LP-CVD (low pressure (CVD) method.

The first polysilicon layer 103 is made of polysilicon containing phosphorus or arsenic as dopant, and formed through a known technique such as a CVD (chemical vapor deposition). The first polysilicon layer 103 functions as a selective gate of the switching transistor, that is, a word line, and has a thickness of 30 nm or higher and 100 nm or lower.

In this embodiment, a method of forming the polysilicon layer in advance is exemplified. Alternatively, after an amorphous silicon film has been formed, the amorphous silicon film may be crystallized through laser annealing because a thermal budget can be reduced during the process. A tungsten silicide film, a titanium silicide film, a cobalt silicide film, or a nickel silicide film may be formed on the dopant diffusion layer 101 through a known silicide technique for the purpose of decreasing the contact resistance.

The selective gate of the switching transistor, that is, the word line may be formed of a first metal wiring 104. The word line is made of, for example, tungsten W or titanium nitride TiN, and formed through a known technique such as a CVD method. It is preferable that the thickness of the first metal wiring 104 is equal to or higher than 30 nm and equal to or lower than 100 nm. When the first metal wiring 104 is too thin, the wiring resistance becomes higher. When the first metal wiring 104 is too thick, a shape control after processing is difficult. It is preferable from the viewpoint of the drive voltage that the thickness is not too thickness because the drive voltage becomes smaller as a volume for writing the phase change material is smaller. Also, it is preferable that the first interlayer film 102, the first polysilicon layer 103, and the first metal wiring 104 are made of a material low in thermal conductivity because the drive voltage of the phase change memory can be decreased.

Figure 8:
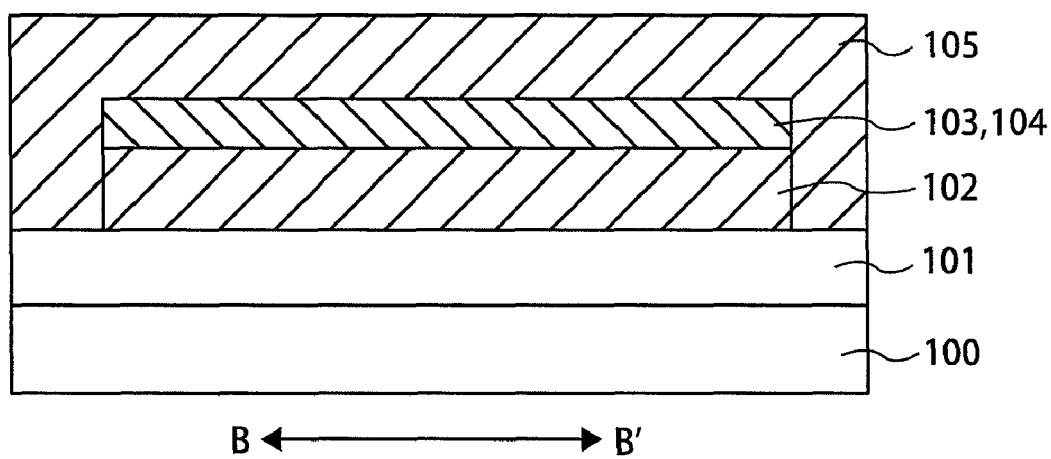
FIG. 8 is a cross-sectional view showing another partial process of manufacturing the semiconductor device subsequently to FIG. 6.
Figure 9:
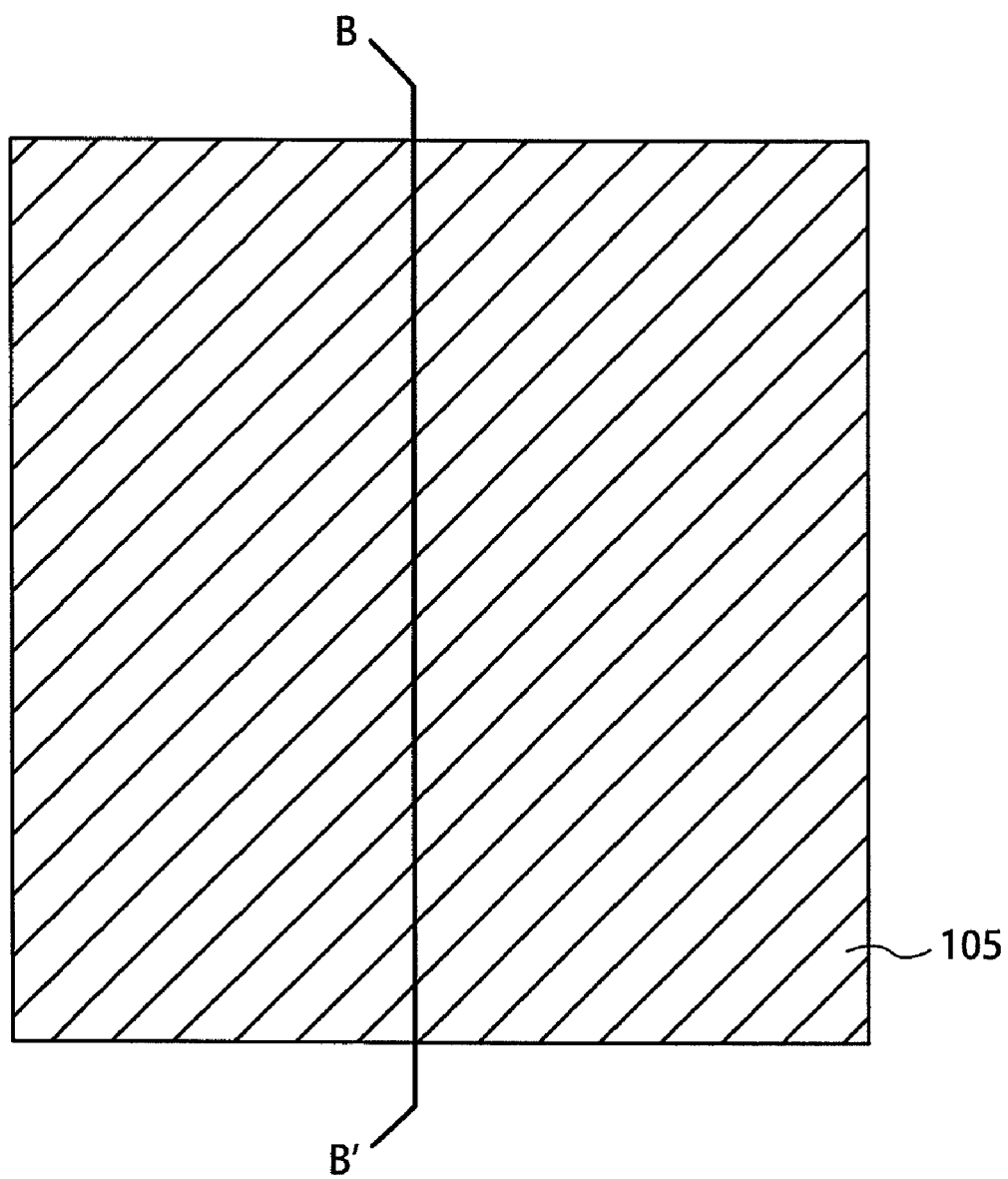
FIG. 9 is a top view showing the partial process of manufacturing the semiconductor device subsequently to FIG. 7.

FIG. 6 is a cross-sectional view showing a partial process of manufacturing the semiconductor device according to this embodiment. In the structure shown in FIG. 6, the first polysilicon 103 as the selective gate, or the first metal wiring 104 is processed through a known lithography technique or a dry etching technology, to thereby form a global selective gate structure. A structure in which a second interlayer film 105 has been formed, and the second interlayer film 105 has been polished through a known CMP technique is shown in FIG. 8, and a top view of the structure is shown in FIG. 9. FIG. 8 is a cross-sectional view taken along a line B-B' in FIG. 9. The second interlayer film 105 is made of, for example, an oxide film $SiO_2$, and formed through a known technique such as an LP-CVD method.

Figure 10:
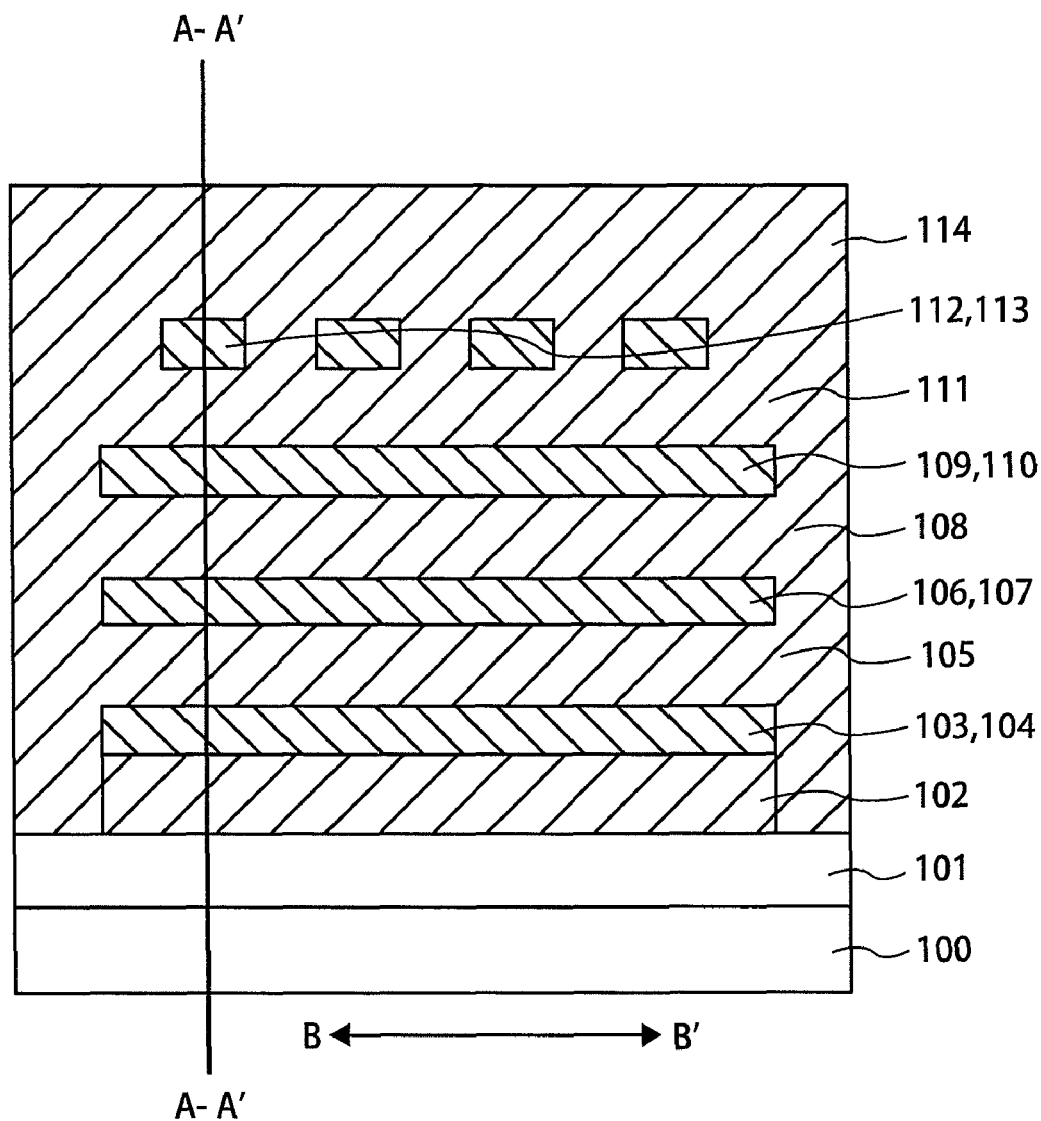
FIG. 10 is a cross-sectional view showing another partial process of manufacturing the semiconductor device subsequently to FIG. 8.
Figure 11:
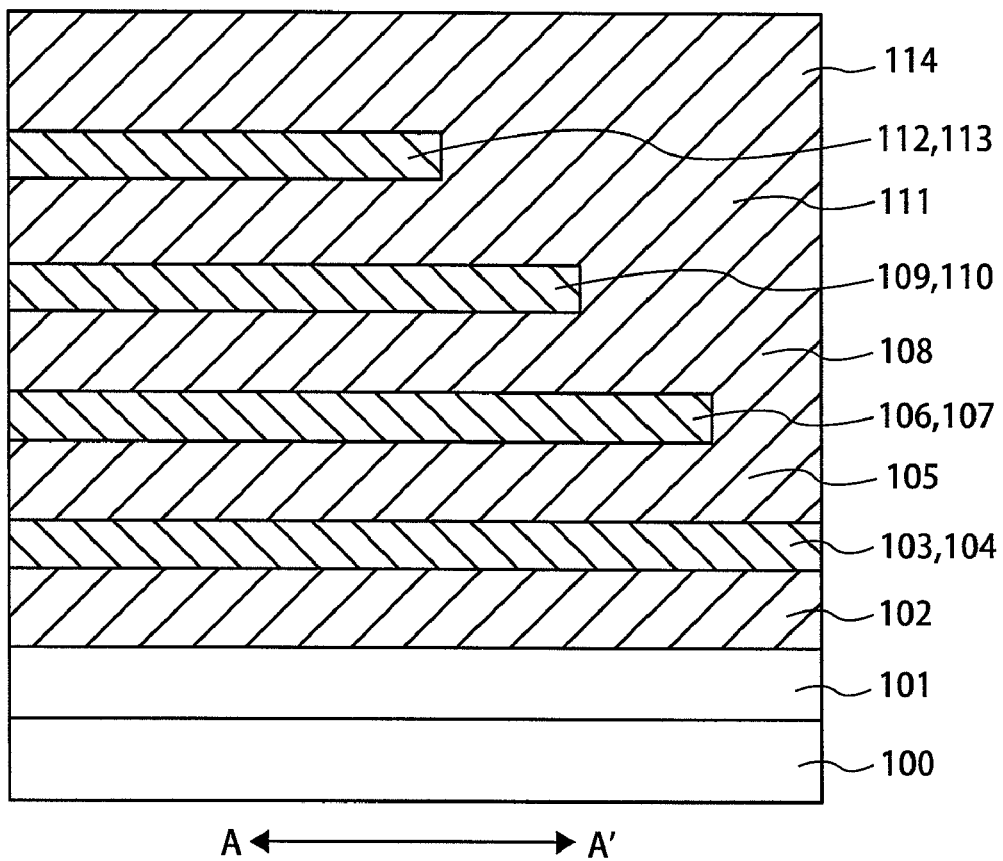
FIG. 11 is a cross-sectional view showing another partial process of manufacturing the semiconductor device subsequently to FIG. 8.
Figure 12:
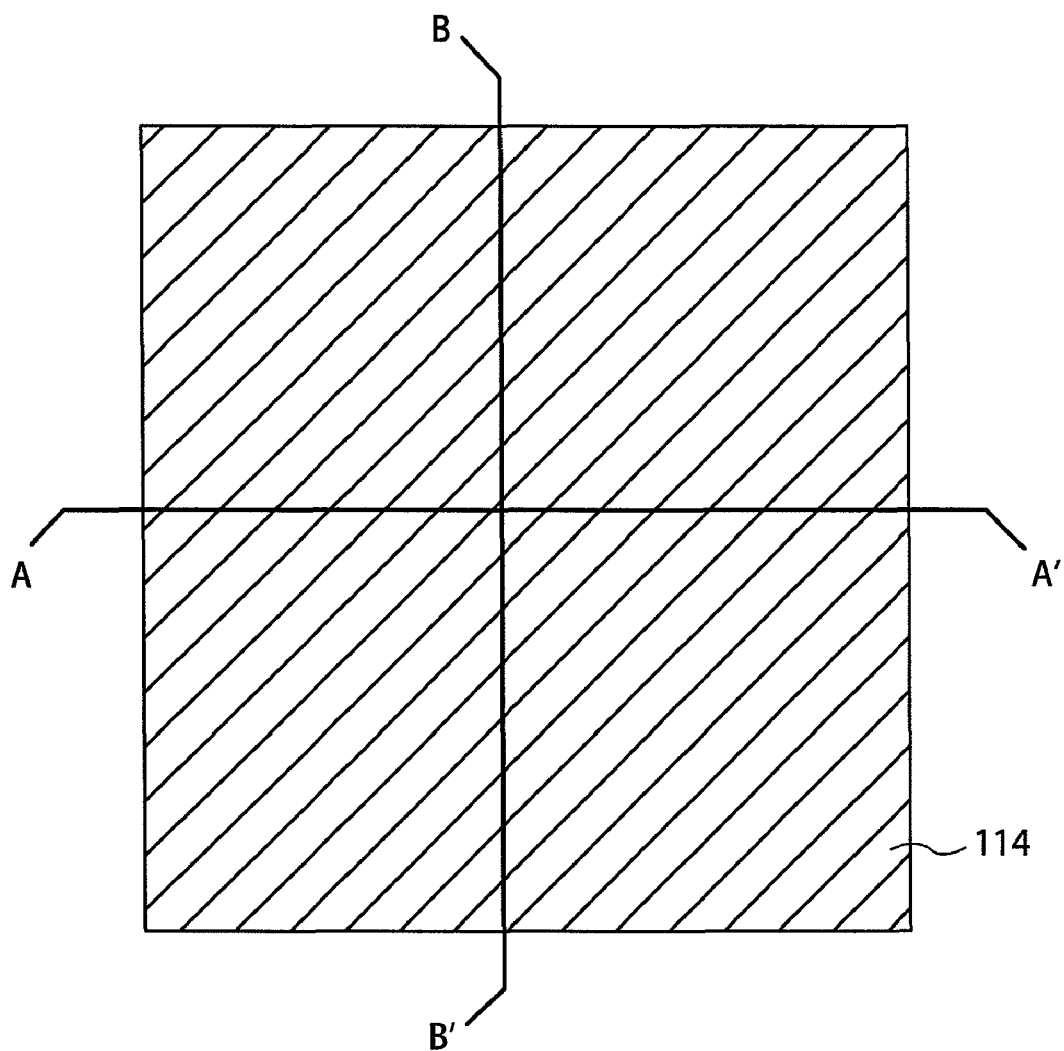
FIG. 12 is a top view showing the partial process of manufacturing the semiconductor device subsequently to FIG. 9.

In a structure shown in FIG. 8, the method described with reference to FIGS. 6 to 9 is repeated to form a second polysilicon layer 106 as the selective gate or a second metal wiring 107, a third interlayer film 108, a third polysilicon layer 109 as the selective gate or a third metal wiring 110, a fourth interlayer film 111, fourth polysilicon layers 112 as the selective gates or fourth metal wirings 113, and a fifth interlayer film 114. The cross section structure is shown in FIGS. 10 and 11, and the top view is shown in FIG. 12. FIG. 10 is a cross-sectional view taken along a line B-B' in FIG. 12, and FIG. 11 is a cross-sectional view taken along a line A-A' in FIGS. 10 and 12. In this case, the fourth polysilicons 112 as the top layer selective gates, or the fourth metal wirings 113 also function as a select transistor for selection of any memory cell block in a three-dimensional memory cell array. For that reason, the selective gate is also of a fine selective gate structure different from the global structure of the lower three layers. The selective gates conduct the operation of selecting the memory cell block in cooperation with bit lines which will be described later.

Figure 13:
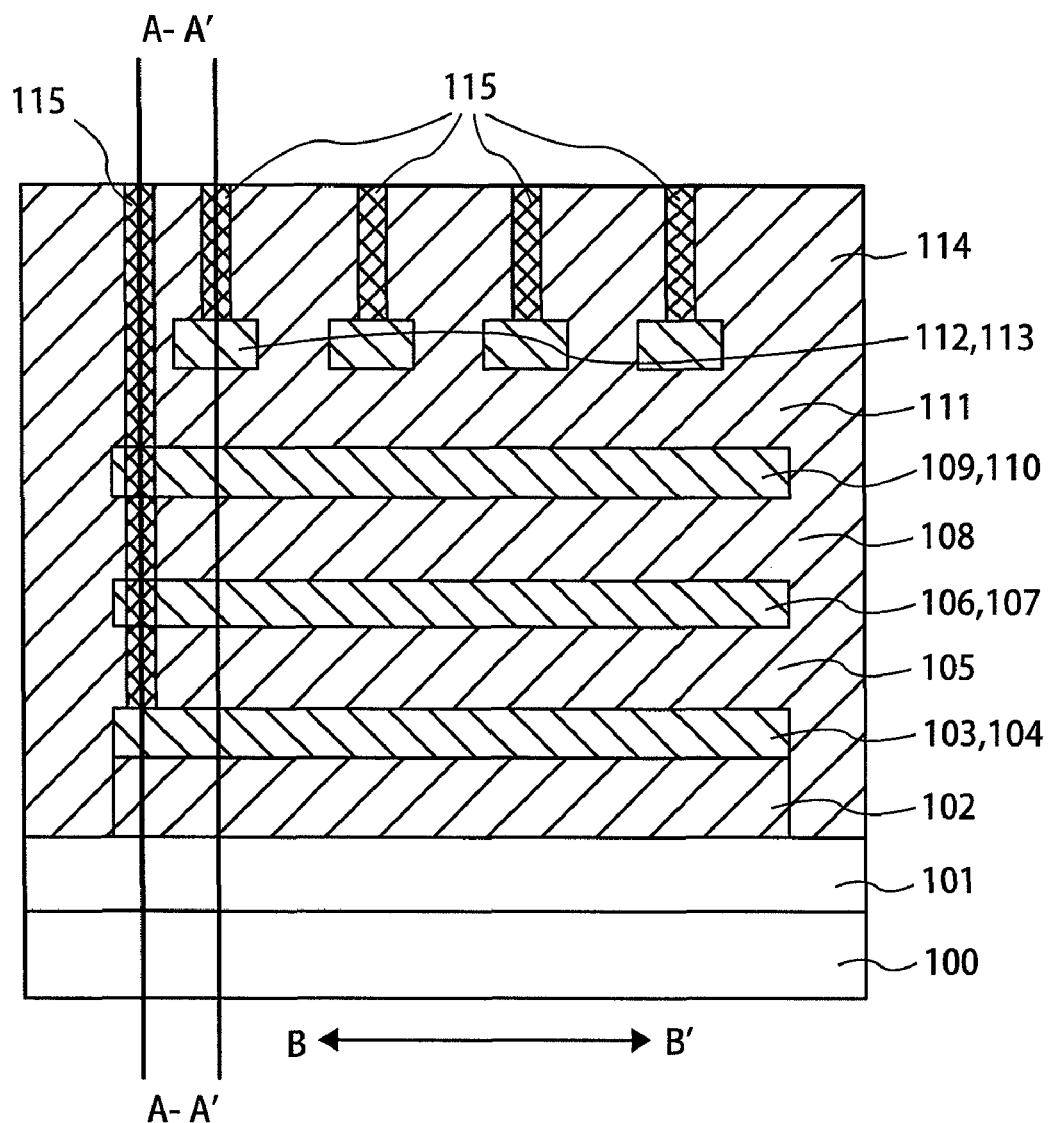
FIG. 13 is a cross-sectional view showing another partial process of manufacturing the semiconductor device subsequently to FIG. 10.
Figure 14:
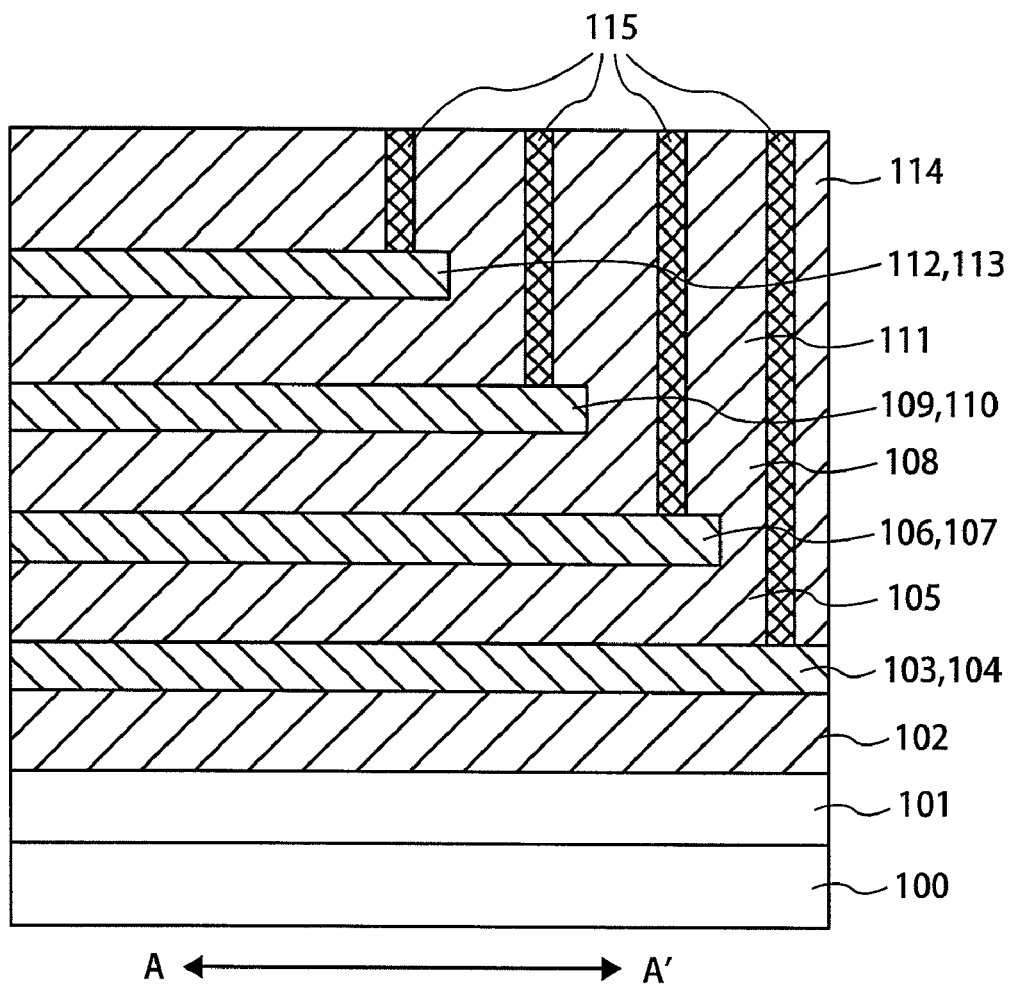
FIG. 14 is a cross-sectional view showing another partial process of manufacturing the semiconductor device subsequently to FIG. 11.
Figure 15:
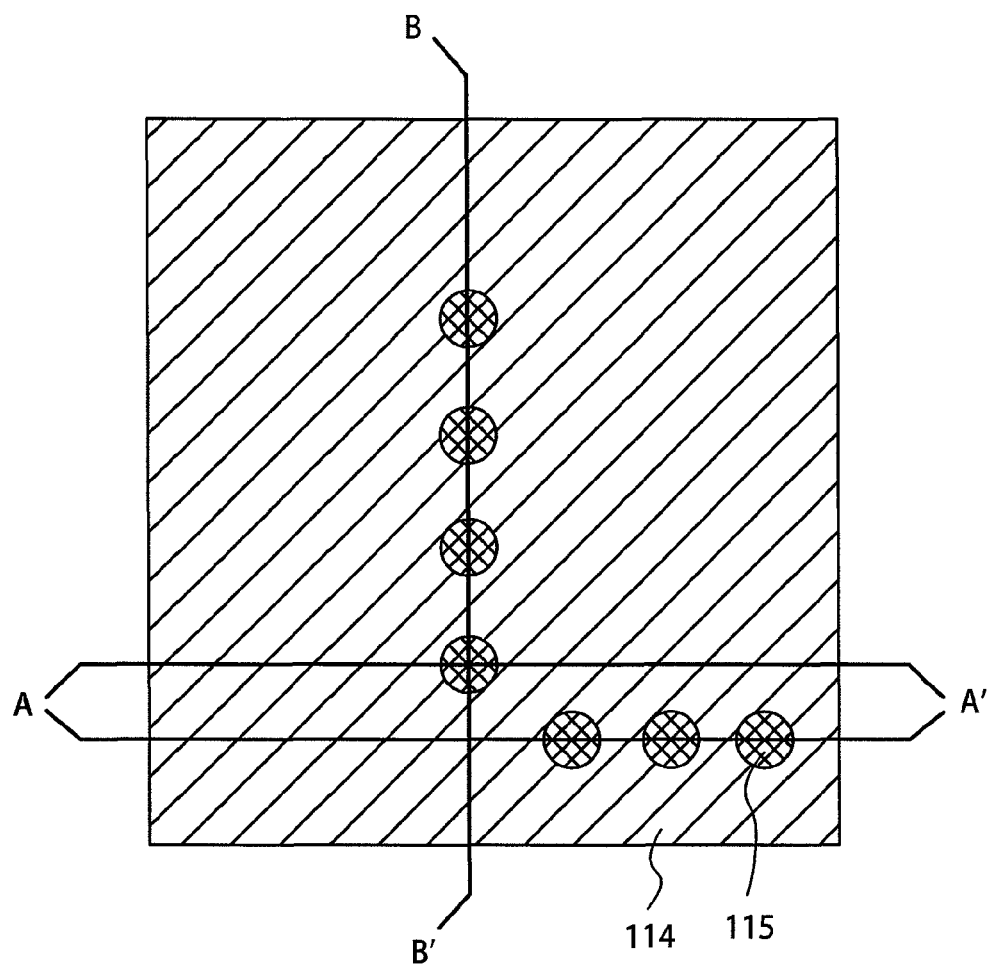
FIG. 15 is a top view showing the partial process of manufacturing the semiconductor device subsequently to FIG. 12.

In the structure shown in FIG. 10, contact plug holes are etched and fifth metal wirings 115 are formed through the known lithography technique, dry etching technique, CMP polishing technique, and CVD technique to form the global selective gate of the switching transistor and the contact plug of the select transistor. The cross section structure after being polished is shown in FIGS. 13 and 14, and the top view is shown in FIG. 15. FIG. 13 is a cross-sectional view taken along a line B-B' in FIG. 15, and FIG. 14 is a cross-sectional view taken along a line A-A' in FIGS. 13 and 15. It is preferable that the fifth metal wirings 115 are made of, for example, tungsten W, and formed through the CVD method in order to implant the fifth metal wirings 115 in the fifth interlayer film 114 with no space therebetween. In this example, for facilitation of description, a depth in a direction along the line A-A' in FIG. 10 is displaced in the drawing.

Figure 16:
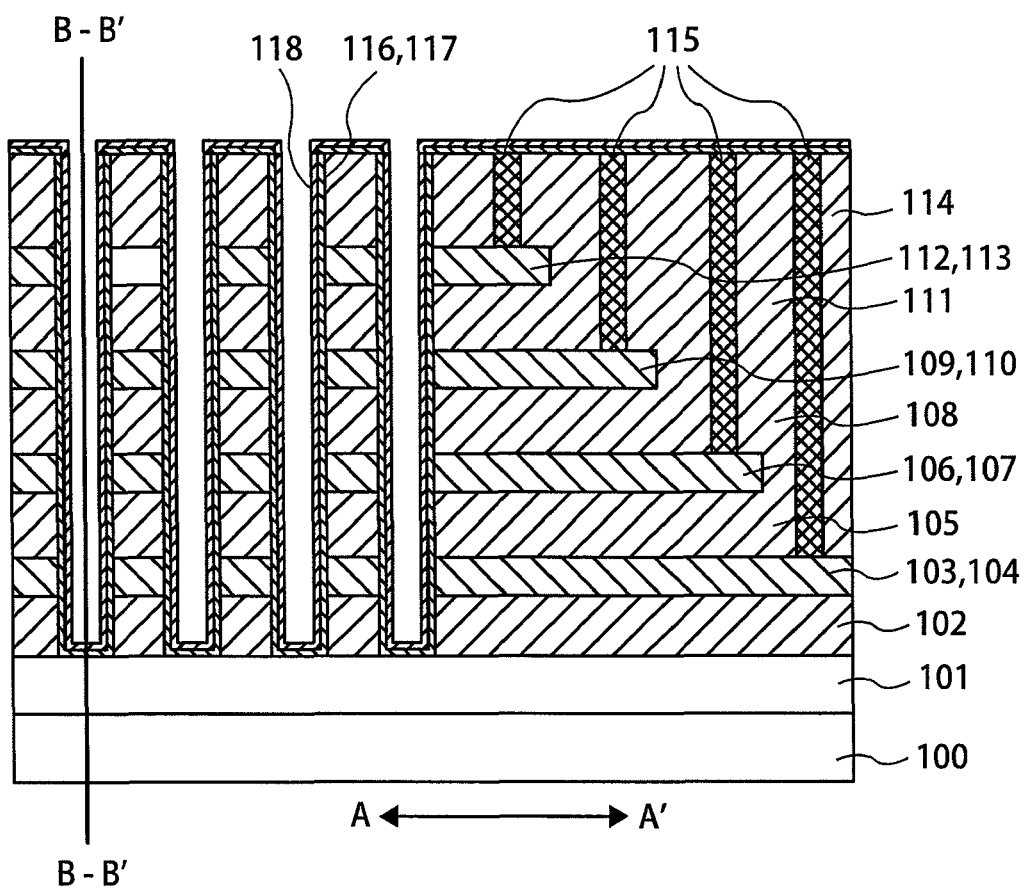
FIG. 16 is a cross-sectional view showing another partial process of manufacturing the semiconductor device subsequently to FIG. 13.
Figure 17:
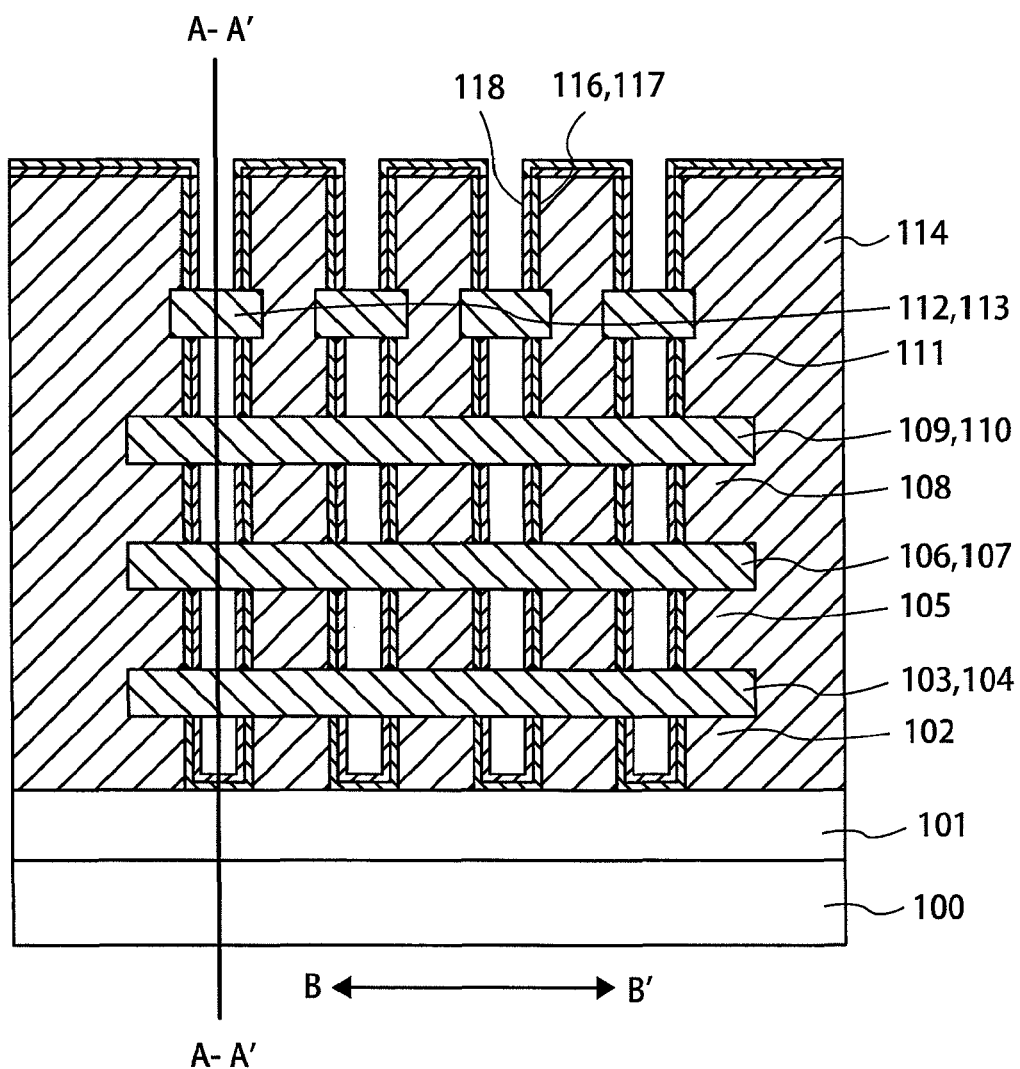
FIG. 17 is a cross-sectional view showing another partial process of manufacturing the semiconductor device subsequently to FIG. 14.
Figure 18:
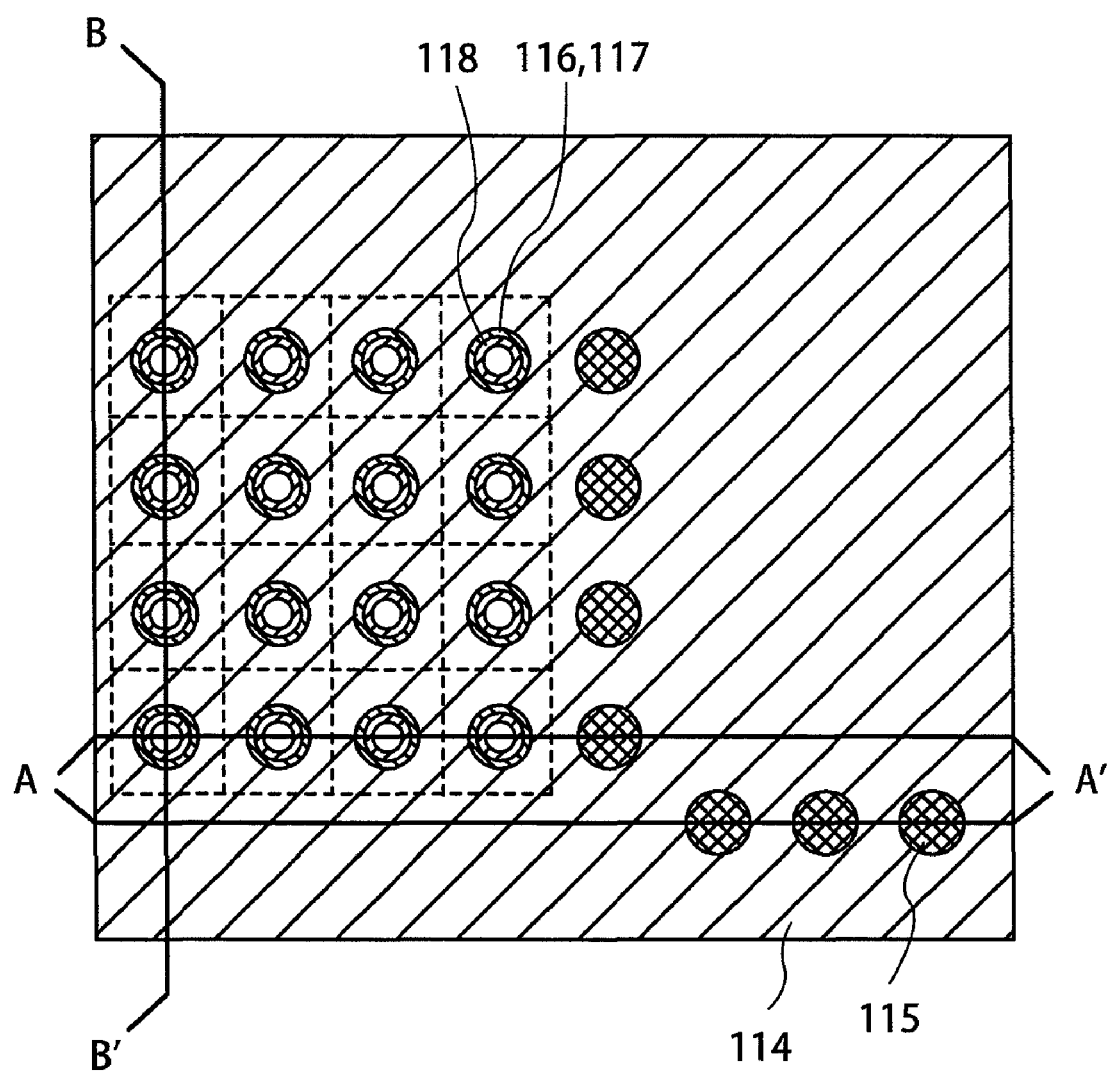
FIG. 18 is a top view showing the partial process of manufacturing the semiconductor device subsequently to FIG. 15.

In the structure shown in FIG. 13, the switching transistor in the memory cell block and deep holes for selective transistor formation are processed through the known lithography technique and dry etching technique. The shape to be processed is preferably precise circular, but may be an arbitrary shape such as square, rectangle or triangle. It is possible to set plural threshold voltages within the same transistor, and plural transistor on-currents, that is, currents flowing in a large number of resistive elements within one memory unit cell according to the shape. Thus, it is possible to conduct the multi-bit memory operation. After an oxide film $SiO_2$ 116 are formed through the known CVD method and ISSG (in situ steam growth) method, or a high-K insulating film 117 is formed through an ALCVD (atomic layer CVD) method on the side walls thereof as the gate insulator of the switching transistor, channel polysilicon layers 118 of the switching transistor and the selective transistor are formed. The polysilicon layer 118 is made of polysilicon containing phosphorus P or arsenic As as dopant, and formed through a known technique such as CVD. The film thickness corresponding to the first and fifth interlayer films is made high in dopant concentration, and operates as a source/drain layer 119 of the transistor. It is desirable that the dopant concentration is equal to or higher than $1 \times 10^{18}$ cm$^{-3}$. On the contrary, the film thickness corresponding to the gate electrode of the switching transistor is made low in dopant concentration, and operates as a channel layer 120 of the transistor. It is desirable that the dopant concentration is equal to or lower than $1 \times 10^{18}$ cm$^{-3}$. In the known technique such as CVD, the above method is simple as the manufacturing method and preferable because polysilicon can be deposited while changing the concentration of phosphorus P or arsenic As during one sequence of the polysilicon deposition. The cross section structure is shown in FIGS. 16 and 17, and the top view is shown in FIG. 18. FIG. 16 is a cross-sectional view taken along a line B-B' in FIG. 18, and FIG. 17 is a cross-sectional view taken along a line A-A' in FIGS. 16 and 18. In this example, for facilitation of description, a depth in a direction along the line B-B' in FIG. 16 and a depth in a direction along the line A-A' in FIG. 17 are displaced in the drawing. With an aim to form a resistance effect element therein, it is important to conduct the deposition while making only the thicker wall anisotropic, and the ALCVD method is more preferable.

Figure 19:
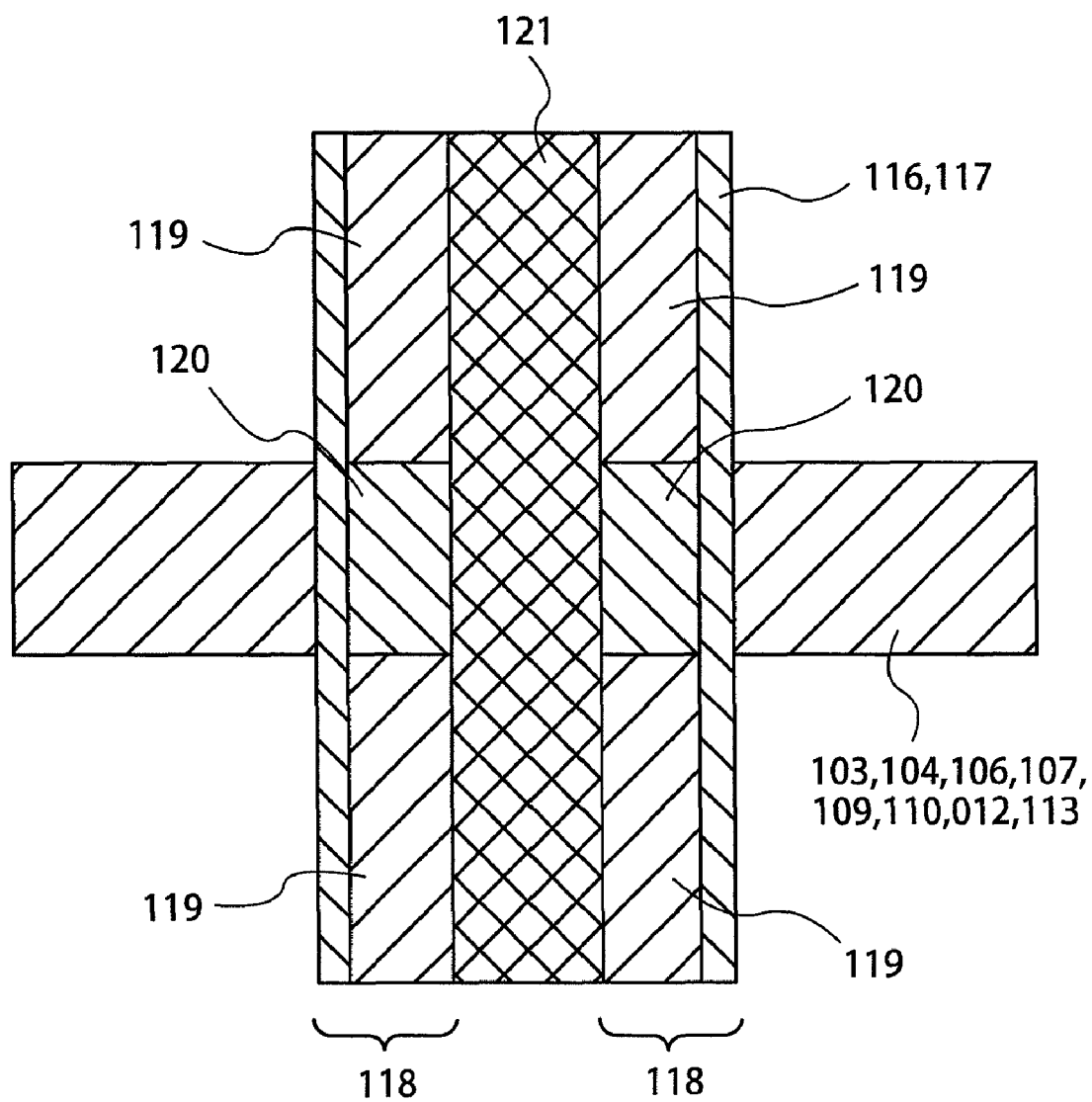
FIG. 19 is a cross-sectional view showing a memory cell in the nonvolatile semiconductor storage device according to the present invention.
Figure 20:
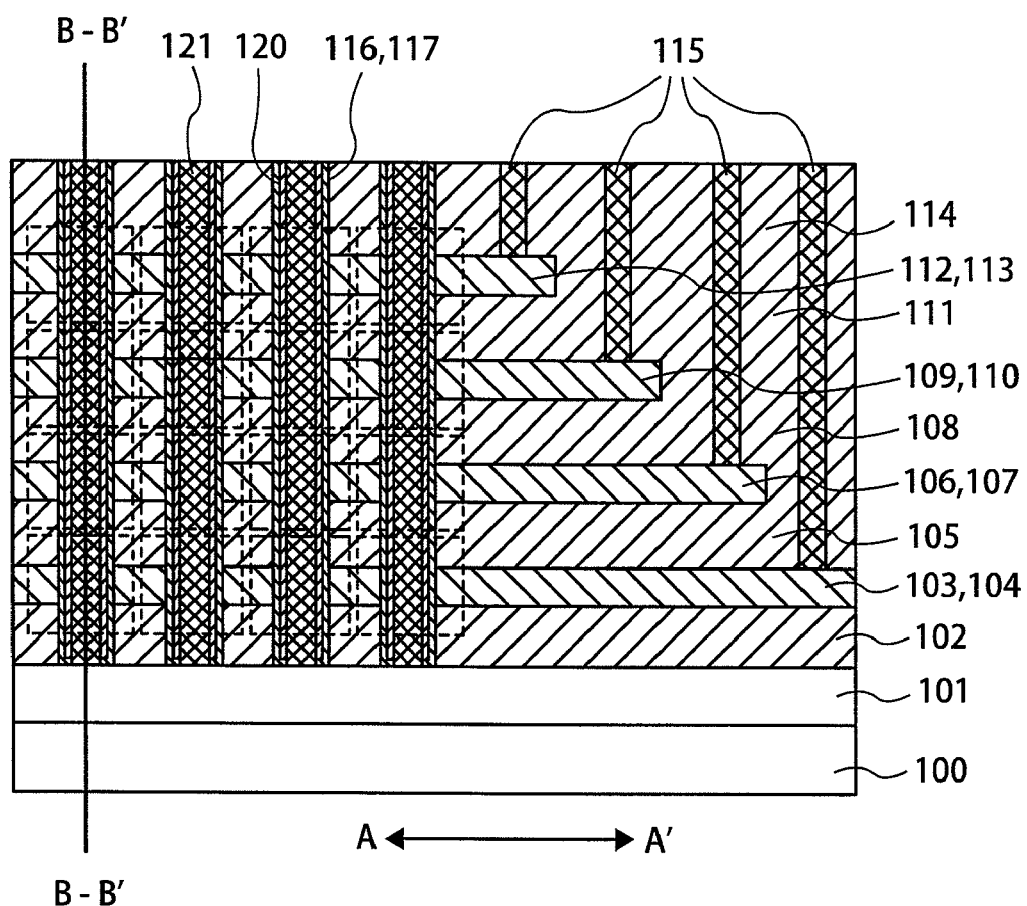
FIG. 20 is a cross-sectional view showing another partial process of manufacturing the semiconductor device subsequently to FIG. 16.
Figure 21:
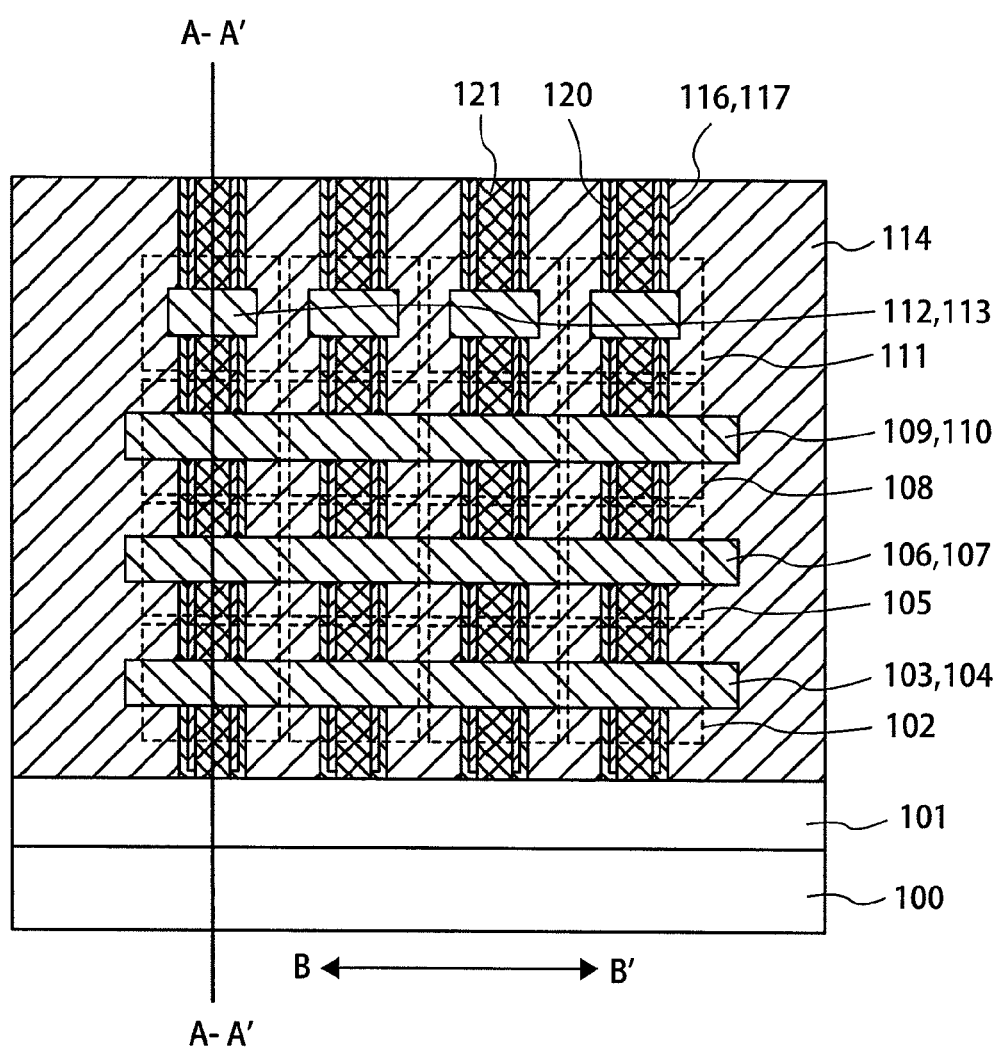
FIG. 21 is a cross-sectional view showing another partial process of manufacturing the semiconductor device subsequently to FIG. 17.
Figure 22:
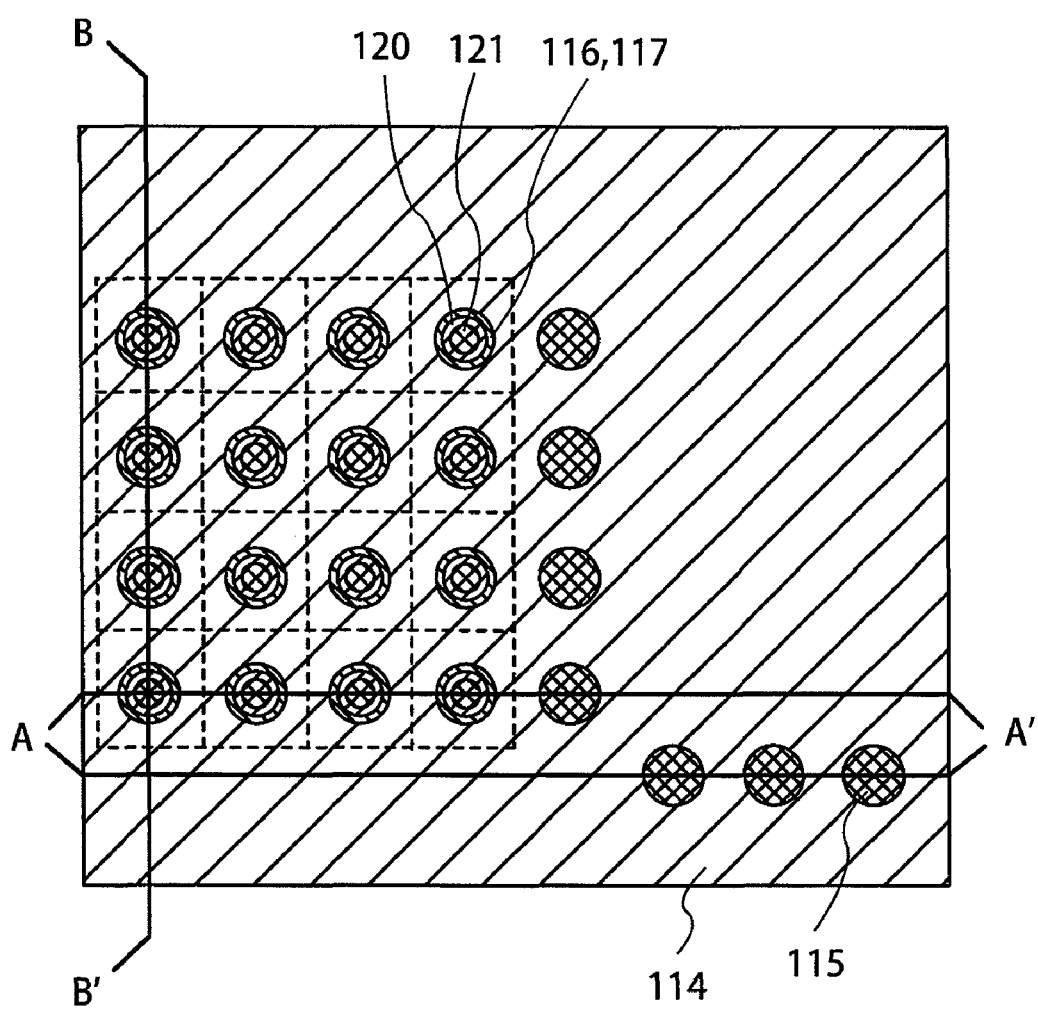
FIG. 22 is a top view showing the partial process of manufacturing the semiconductor device subsequently to FIG. 18.
Figure 23:
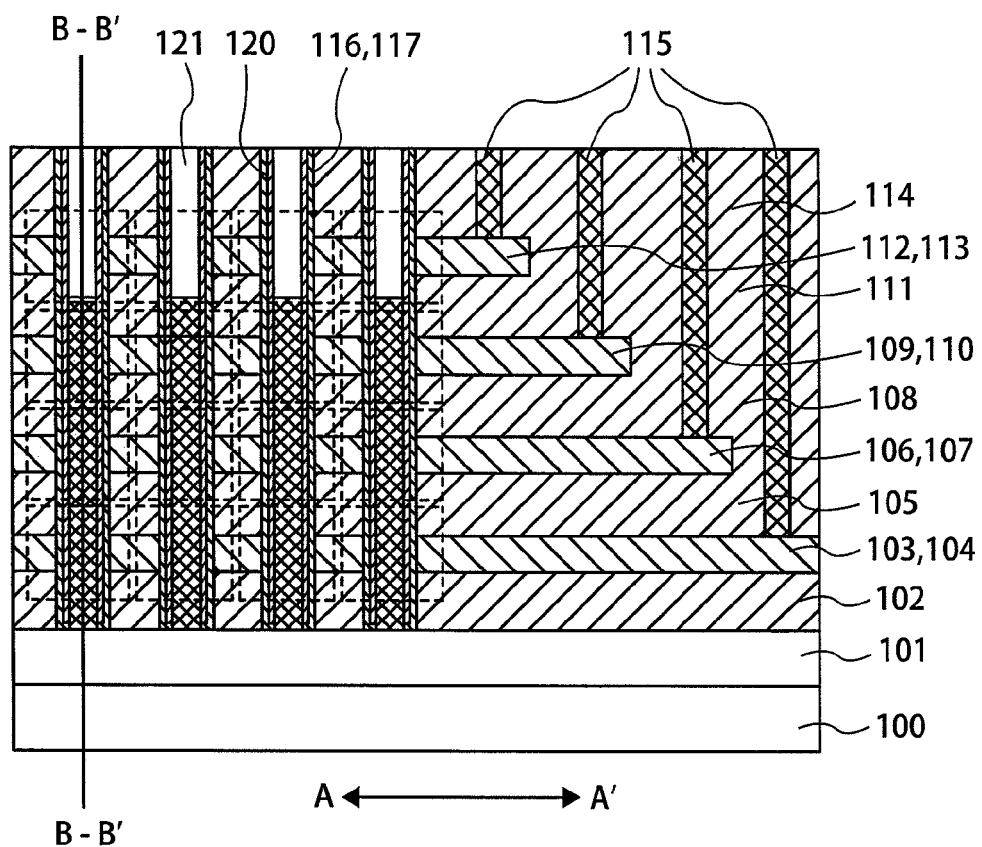
FIG. 23 is a cross-sectional view showing another partial process of manufacturing the semiconductor device subsequently to FIG. 20.
Figure 24:
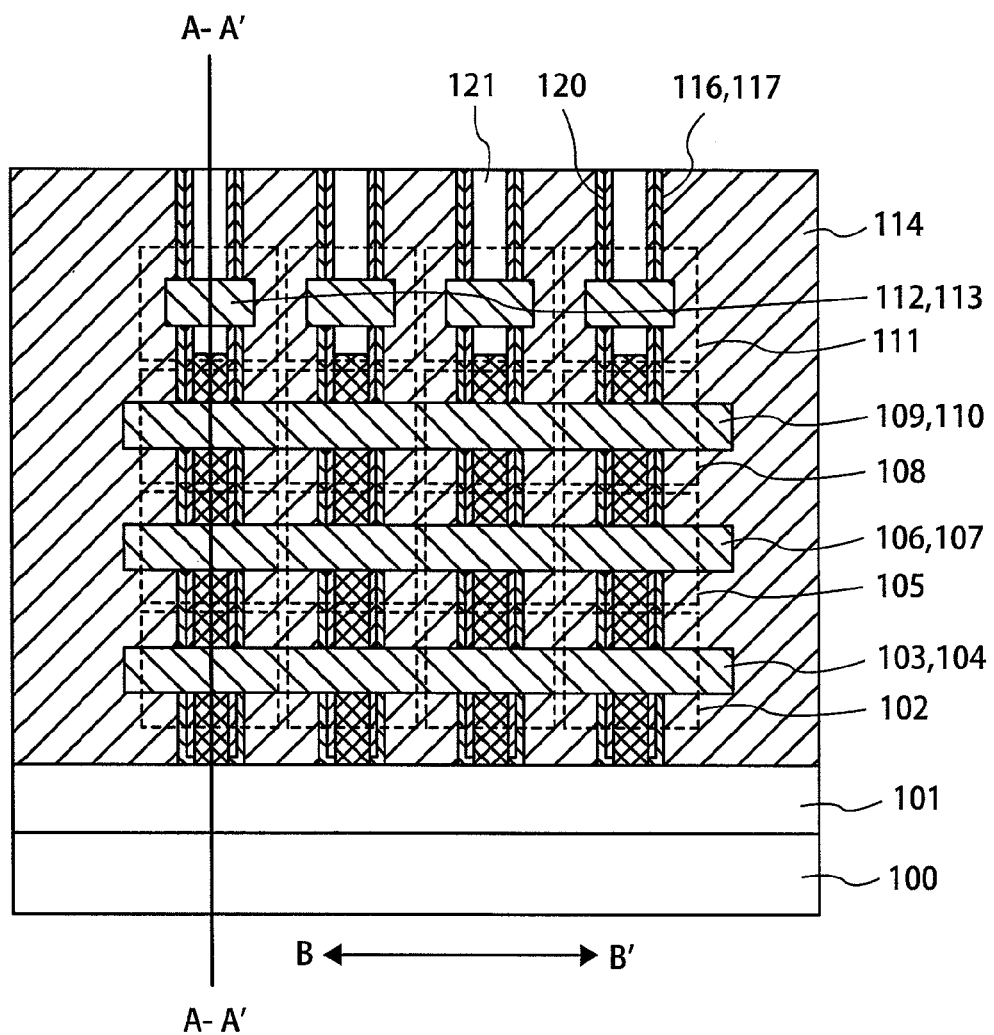
FIG. 24 is a cross-sectional view showing another partial process of manufacturing the semiconductor device subsequently to FIG. 21.

In the structure shown in FIG. 16, a phase change material 121 is deposited inside of the transistor as a resistance effect element. The phase change material 121 is made of, for example, $Ge_2Sb_2Te_5$, and formed through a known technique such as the sputtering method. As another phase change material, a composition is selected from a material containing at least one element among chalcogen elements (S, Se, Te) to obtain the same performance. The thickness of the phase change material 121 is preferably equal to or higher than 5 nm and equal to or lower than 300 nm. It is desirable that sputter etching is conducted in advance before the phase change material 121 has been deposited, the oxide film $SiO_2$ 116, the high-K insulating film 117, or the channel polysilicon layer 118 remaining on the bottom surface of the memory cell block is removed to keep a good contact of the dopant diffusion layer 101 on the semiconductor substrate 100 with the phase change material 121. Thereafter, the polysilicon layer 118 and the phase change material 121 remaining on the fifth interlayer film are removed. The cross-sectional view of the unit memory cell structure is shown in FIG. 19. The entire cross section structure is shown in FIGS. 20 and 21, and the top view is shown in FIG. 22. FIG. 20 is a cross sectional view taken along a line B-B' in FIG. 22, and FIG. 21 is a cross sectional view taken along a line A-A' in FIGS. 20 and 22. In this example, for facilitation of description, a depth in a direction along the line B-B' in FIG. 23 and a depth in a direction along the line A-A' in FIG. 24 are displaced in the drawing. A unit memory cell is a portion enclosed by dotted lines shown in FIGS. 20 to 22.

Figure 25:
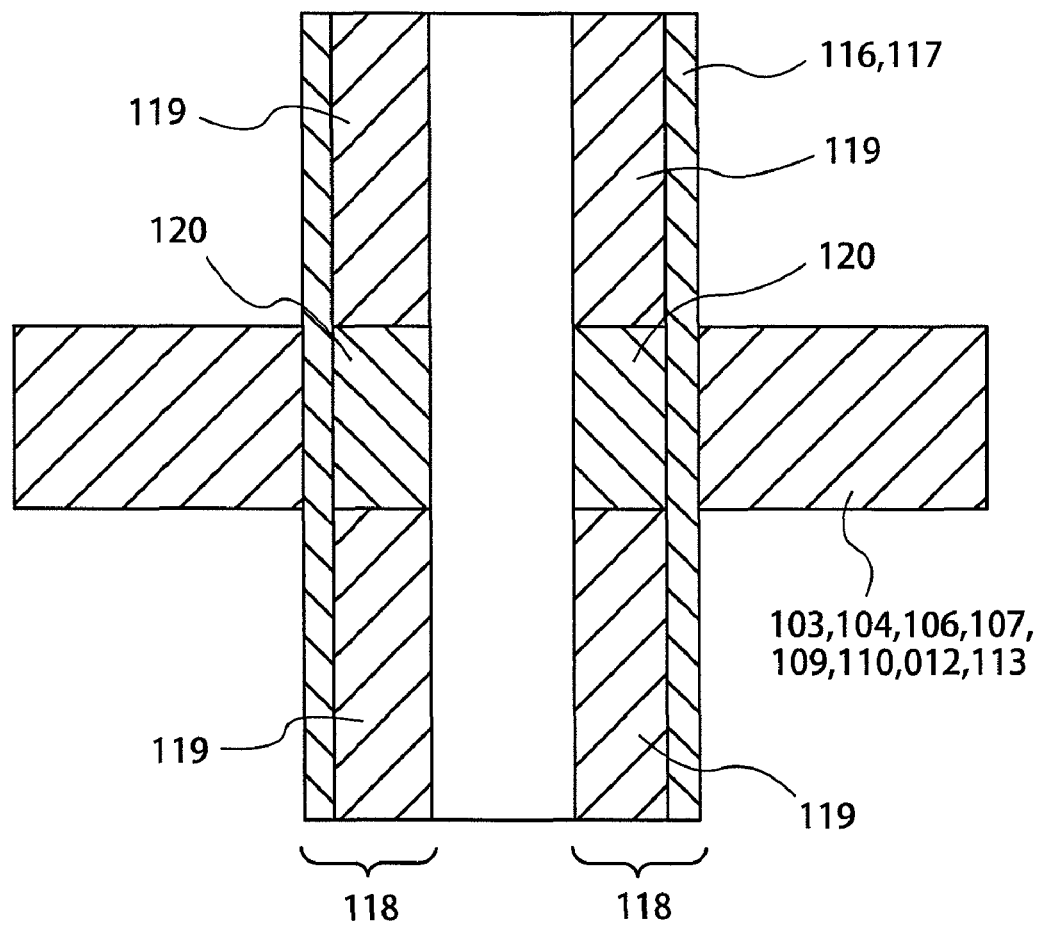
FIG. 25 is a cross-sectional view showing a memory cell in the nonvolatile semiconductor storage device according to the present invention.

In the structure shown in FIG. 20, to keep the selectivity of memory blocks only in the selective transistor portion of the first node, the phase change material 121 of a resistance effect element inside the transistor is removed using a known dry etching technology. The entire cross section structure is shown in FIGS. 23 and 24. FIG. 23 is a cross sectional view taken along a line B-B' in FIG. 22, and FIG. 24 is a cross sectional view taken along a line A-A' in FIGS. 22 and 23. In this example, for facilitation of description, a depth in a direction along the line B-B' in FIG. 23 and a depth in a direction along the line A-A' in FIG. 24 are displaced in the drawing. The cross-sectional view of the cell structure in the selective transistor portion is shown in FIG. 25. Because of no internal resistive element, because only a current flowing into the selective transistor can be controlled by voltage control of the word line of the selective transistor, the operation of selecting the memory block can be conducted.

Figure 26:
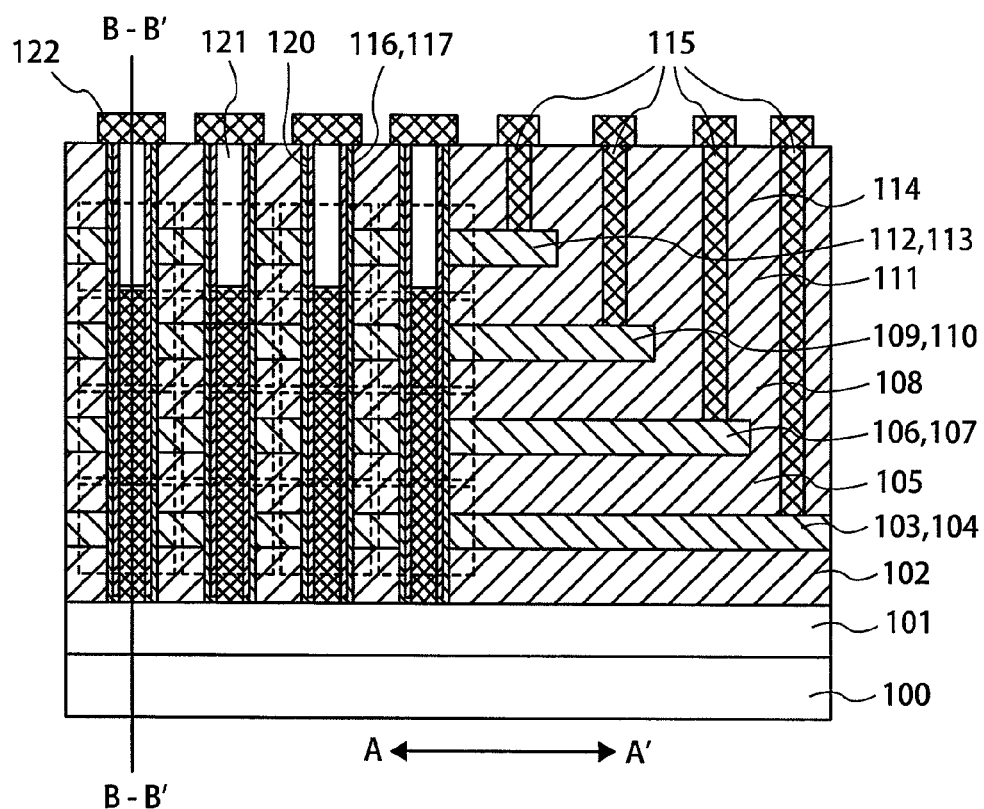
FIG. 26 is a cross-sectional view showing another partial process of manufacturing the semiconductor device subsequently to FIG. 23.
Figure 27:
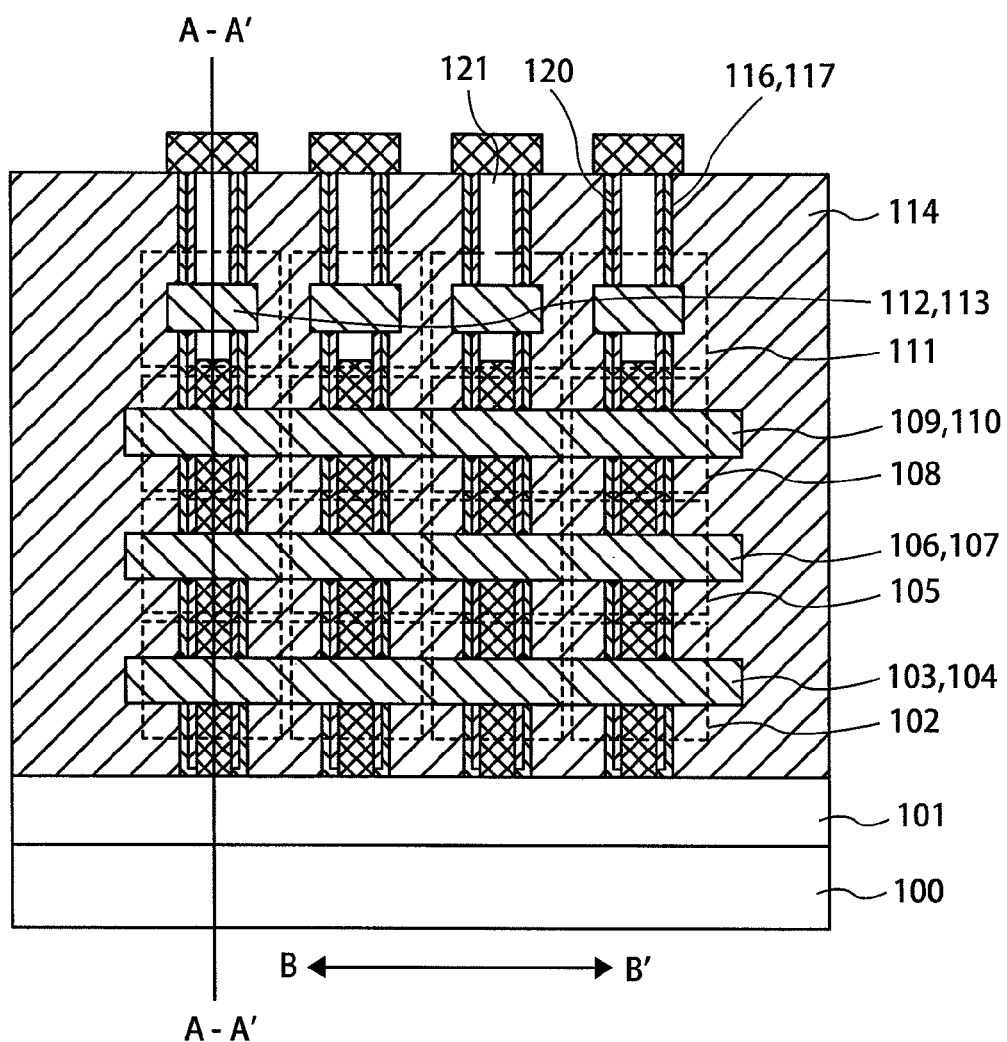
FIG. 27 is a cross-sectional view showing another partial process of manufacturing the semiconductor device subsequently to FIG. 24.
Figure 28:
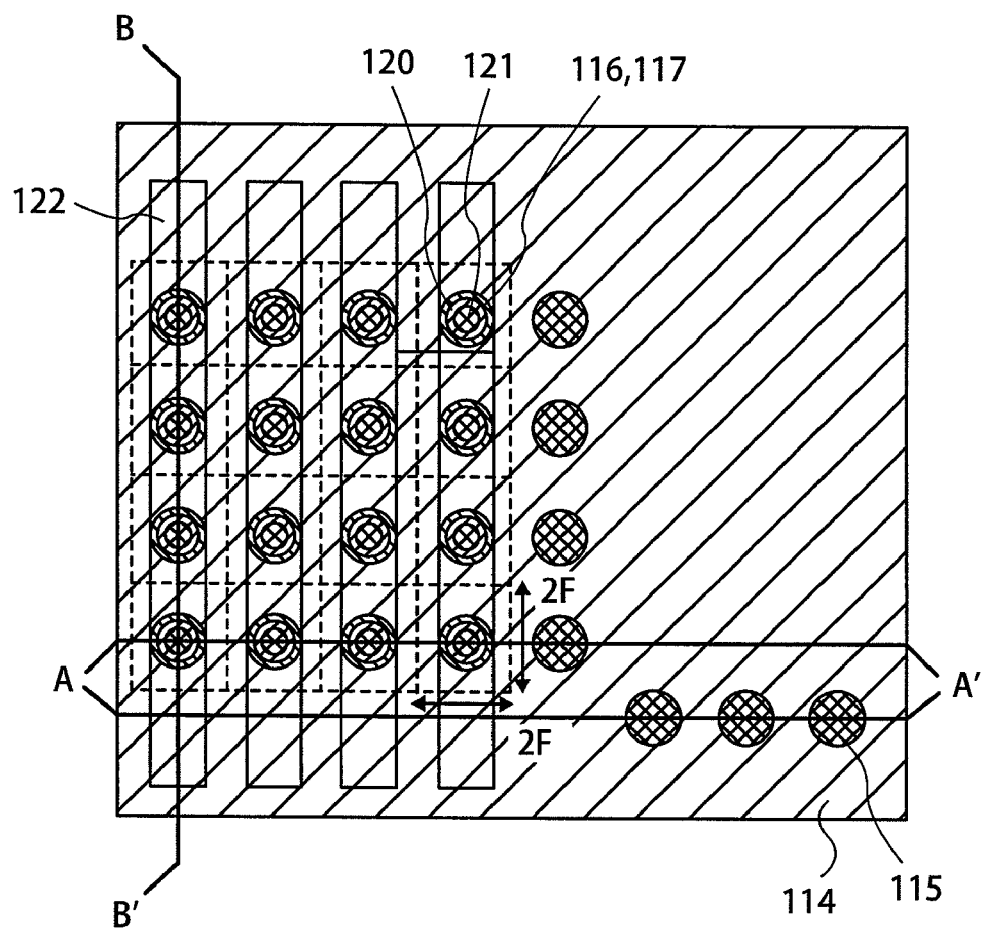
FIG. 28 is a cross-sectional view showing another partial process of manufacturing the semiconductor device subsequently to FIG. 25.

In the structure shown in FIG. 23, sixth metal wirings 122 are formed through the known lithography technique and the dry etching technique. The six metal wirings 122 are made of, for example, tungsten W, and formed through the known CVD method and sputtering method. The sixth metal wirings 122 are a pattern of bit lines of the memory, and extend in parallel to the adjacent pattern. The entire cross section structure is shown in FIGS. 26 and 27, and the top view is shown in FIG. 28. FIG. 26 is a cross-sectional view taken along a line B-B' in FIG. 28, and FIG. 27 is a cross sectional view taken along a line A-A' in FIGS. 26 and 28. In this example, for facilitation of description, a depth in a direction along the line B-B' in FIG. 26 and a depth in a direction along the line A-A' in FIG. 27 are displaced in the drawing. Each selective gate and each bit line are electrically connected to the semiconductor substrate 100 including the peripheral circuit so as to read and write the nonvolatile memory, which is omitted from the drawings. As shown in FIG. 28, the plane shape of the memory cell block is square. In this example, it is assumed that the minimum processing dimensions based on the design rule are "F (feature size)". That is, all of the longitudinal and lateral lengths of the plan shape of the memory cell block, the contact diameter, and the gate length are "F". The "F" is determined according to a precision of the lithography in that generation. The lengths of the plan shape of the memory cell block in the respective directions are 2F. Accordingly, the size of the memory cell block according to this embodiment is $4F^2$ (2F×2F), and the same cell size as that of a NAND flash memory can be realized.

In the drawing of this embodiment, the stacked memory of vertical four-layer lamination is exemplified. However, the manufacturing methods shown in the sequential drawings are repeated, thereby enabling the number of stack of the laminated memory in the vertical direction to be freely designed.

Figure 2A:
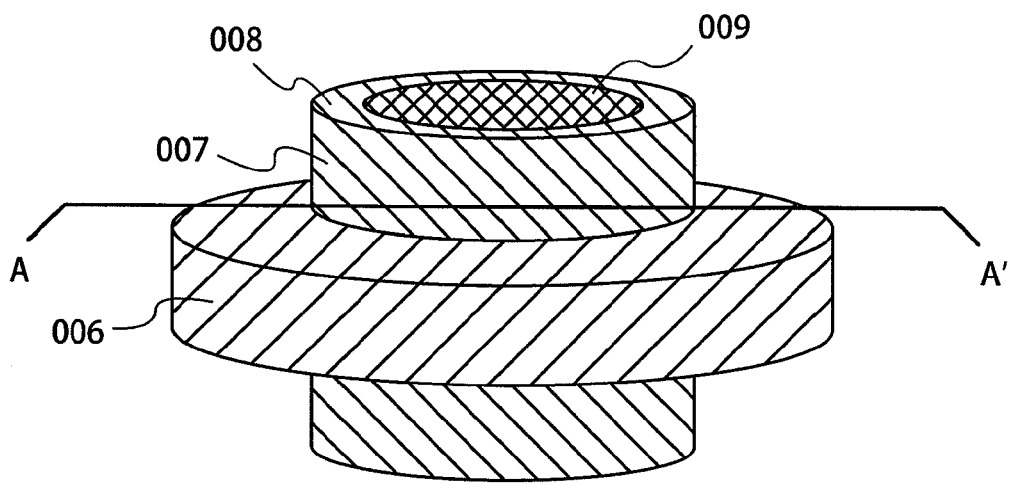
FIGS. 2A and 2B are bird's eye views showing a memory cell in the nonvolatile semiconductor storage device according to the present invention.
Figure 2B:
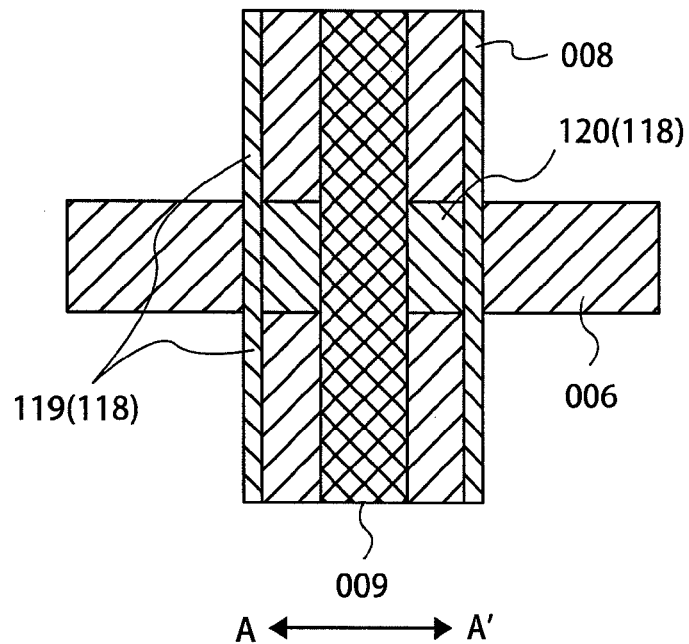
Figure 3:
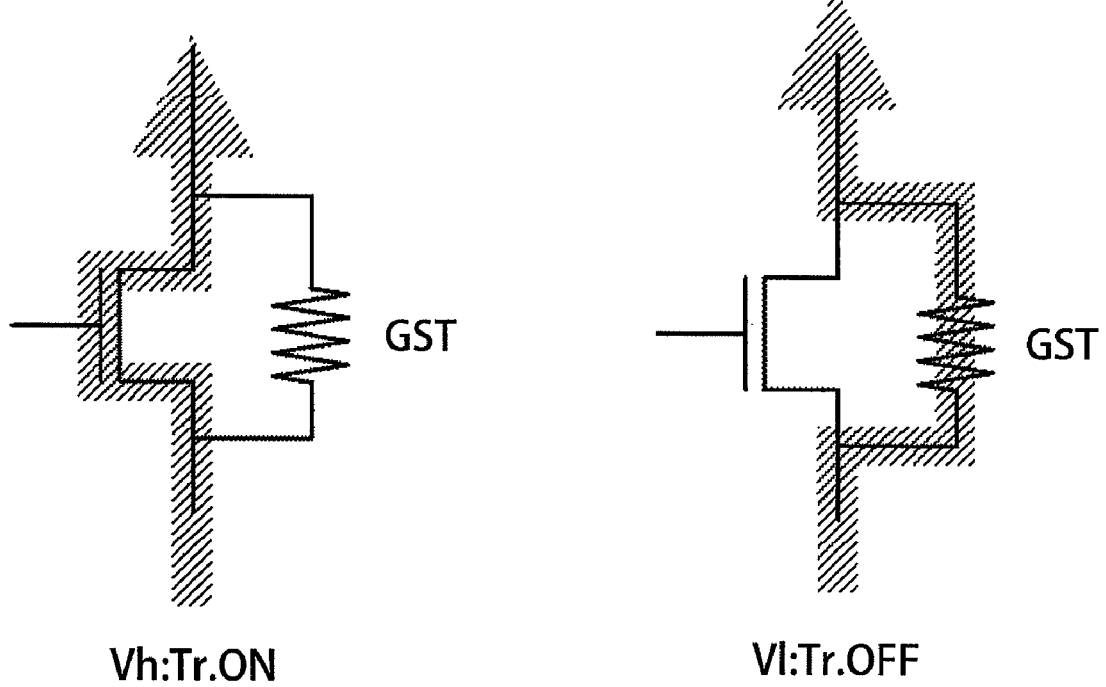
FIG. 3 is a circuit diagram showing the operation of the memory cell in the nonvolatile semiconductor storage device according to the present invention.
Figure 4:
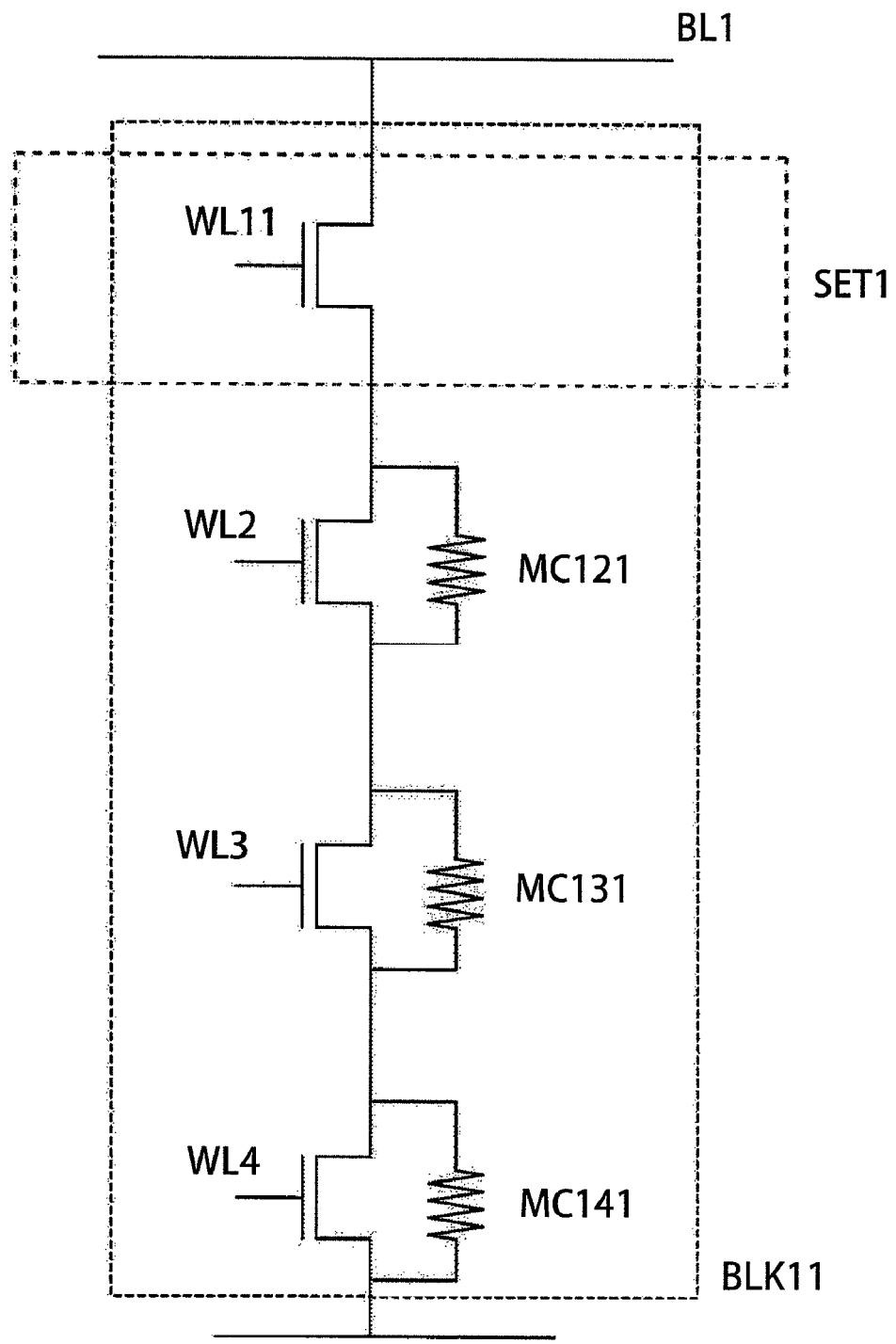
FIG. 4 is a circuit diagram showing the configuration of the nonvolatile semiconductor storage device according to the present invention.
Figure 5:
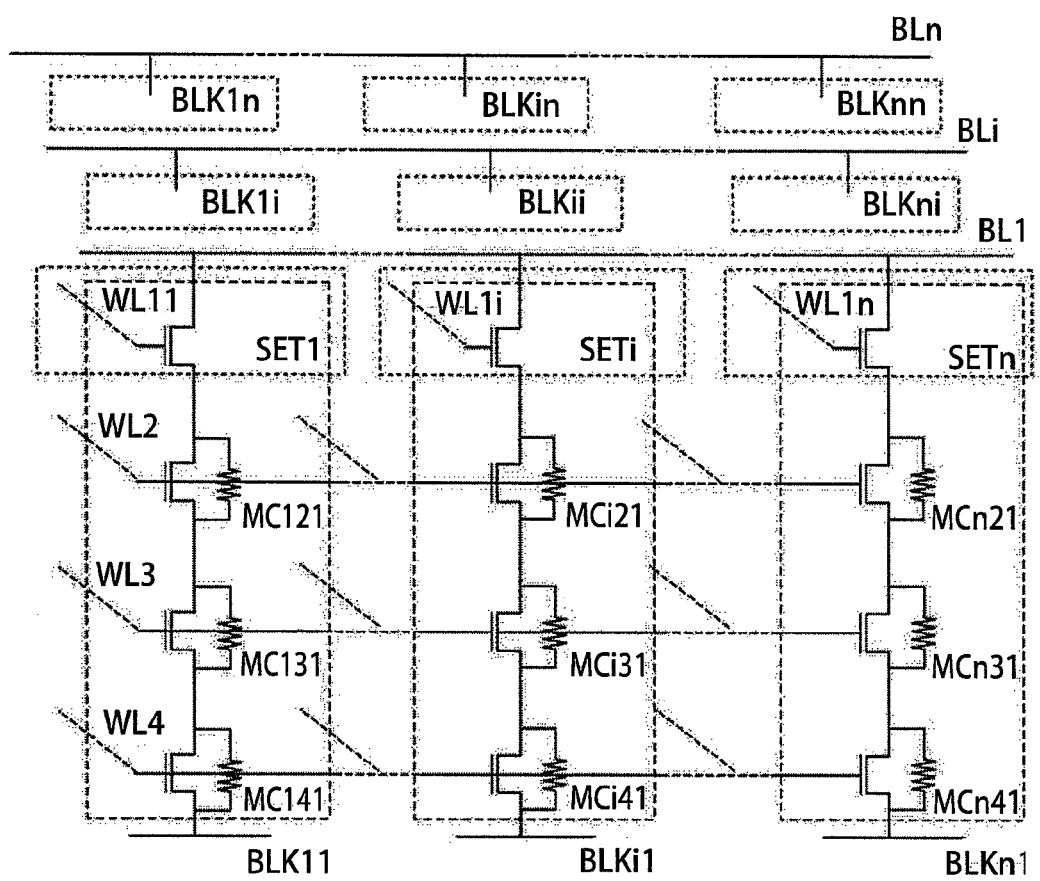
FIG. 5 is a circuit diagram showing the configuration of the nonvolatile semiconductor storage device according to the present invention.

Subsequently, the operation system of the memory matrix to which the present invention is applied will be described with reference to FIGS. 4 and 5. Memory cells MCijk (i=1, 2, 3, . . . , m) (j=1, 2, 3, . . . , n) (k=1, 2, 3, . . . , m) are arranged at cross points of plural word lines WLi (i=1, 2, 3, . . . , m) disposed in parallel, and plural bit lines BLj (j=1, 2, 3, . . . , n) disposed in parallel. As shown in FIG. 2, in the structure, the switching transistor and the phase change material are connected in parallel.

The recording in the phase change memory is conducted as follows. The memory cell MC 121 is exemplified. However, the same is applied to other cells. A voltage Vh is applied to a word line WL11 of the selective transistor, and a voltage Vl is applied to other word lines WL1i. Further, the voltage Vh is applied to a first bit line BL1, and the voltage Vl is applied to other bit lines BLi to select the memory cell block BL11. The voltage Vl is applied to the switching transistor word line WL11 corresponding to MC121, and a current flows in the resistance effect element of MC121 to store information. The read of the nonvolatile memory is executed as follows. For example, in the case of reading information from the memory cell MC 121, the voltage Vh is applied to the word line WL11 of the selective transistor, and the voltage Vl is applied to other word lines WL1i. Further, the voltage Vh is applied to the first bit line BL1, and the voltage Vl is applied to other bit lines BLi to select the memory cell block BL11. A voltage Vm is applied to the switching transistor word line WL11 corresponding to MC121 to read information based on a magnitude of the current flowing in BL1.

In the description and drawings of this embodiment, the stacked memory formed by the vertical four-layer stack and an array of 4×4 blocks in the planar direction is typically described. However, it is needless to say that the number of stack of the memory and the number of blocks configuring the array can be freely set by repeating the manufacturing method shown in the sequential drawings.

Figure 29:
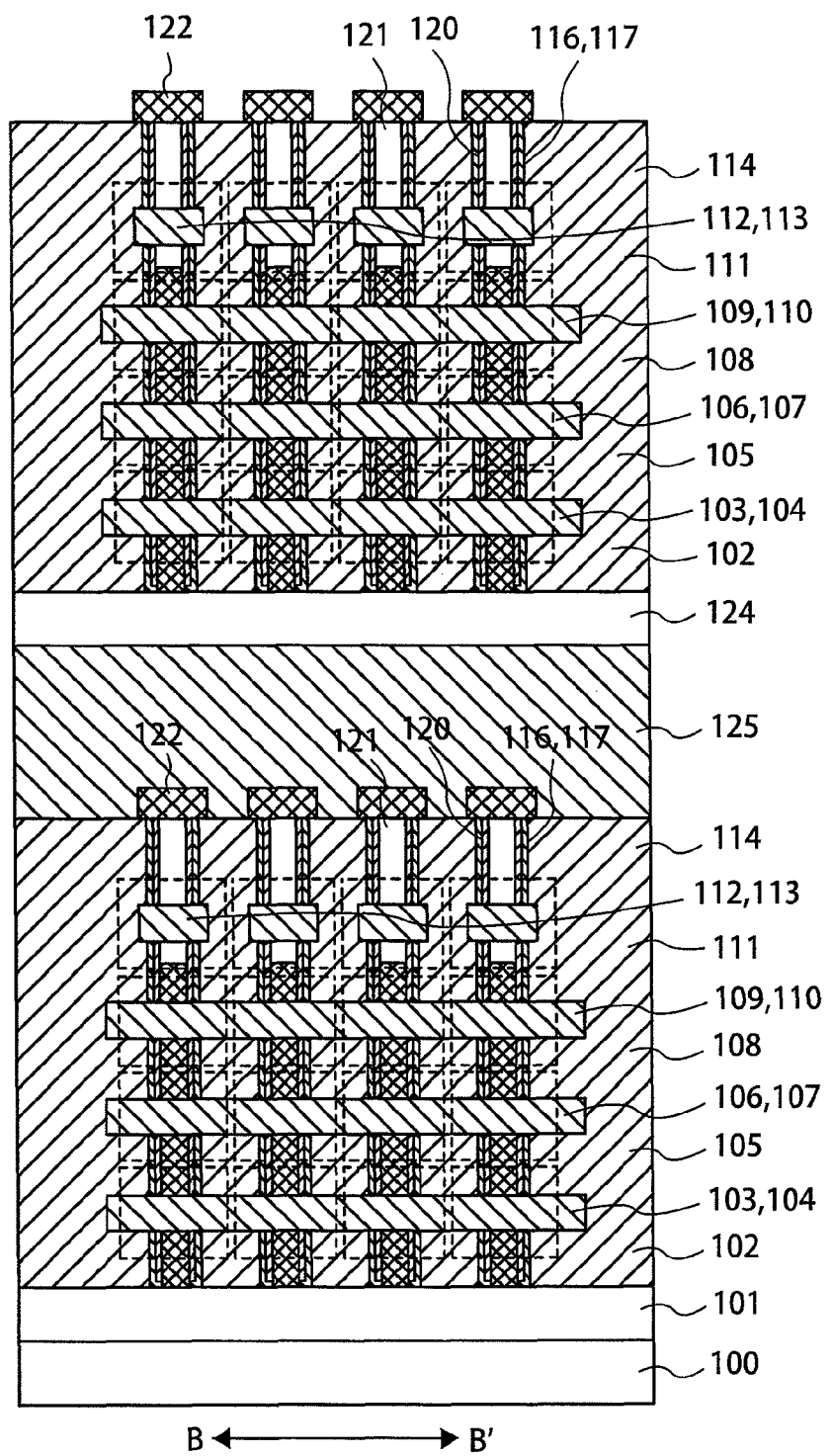
FIG. 29 is a cross-sectional view showing the configuration of the nonvolatile semiconductor storage device according to the present invention.

The above description has been given of the manufacturing method in the case where the memory matrix is of one hierarchy. However, in order to increase the bit concentration of the memory cell, it is more preferable to stack the memory matrixes. For example, as shown in FIG. 29, when the memory matrixes are stacked in two hierarchies, a sixth interlayer film 123 and a fifth polysilicon layer 124 being a substrate of the second hierarchy are formed on the structure of FIGS. 26 and 27, that is, on the sixth metal wiring 122 through the known CVD technique, and CMP polishing technique. Further, the second hierarchy of the memory matrix is formed in the same method as that described in this embodiment with reference to FIGS. 6 to 28, thereby enabling two hierarchies of the memory matrixes to be realized. Further, in the case of stacking k layers (k=1, 2, 3, . . . , 1) of memory matrixes, the memory matrixes are manufactured in the same manner.

Also, in this embodiment, the switching transistors and the selective transistors are formed of n-type MOS transistors; however, the present invention is not limited to this configuration. Those transistors are formed of p-type MOS transistors. In this case, it is possible that an n-type semiconductor substrate is used for the semiconductor substrate 100, and the region 101 is formed of a p$^+$ type diffusion region.

The embodiments of the present invention have been described above. However, the present invention is not limited to the respective embodiments, and various embodiments can be assumed without departing from the technical concept of the invention.

What is claimed is:

1. A semiconductor storage device, comprising:
    a semiconductor substrate on which circuits including a peripheral circuit are disposed;
    a memory cell block having a plurality of memory cells connected in series as one unit, each of the plurality of memory cell including a core disposed columnarly above the semiconductor substrate and made of a material having a variable resistance value, an insulating thin film disposed on a side surface of the core through a semiconductor thin film, and a conductive film selectively disposed on a surface of the insulating thin film through the insulating thin film;
    a first layer disposed between the semiconductor substrate and the memory cell block; and
    a second layer disposed above the memory cell block, a bit line being provided in the second layer,
    wherein the memory cell has a switching transistor and a resistance effect element electrically connected in parallel to the switching transistor, the switching transistor has the insulating thin film as a gate insulator, the conductive film as a gate electrode, and the semiconductor thin film as a channel, and the resistance effect element has the core region as a resistor,
    wherein the memory cell block includes a first node configured by a selective transistor, and second to n-th ($\geqq 2$) nodes configured by each of the plurality of memory cells,
    wherein the selective transistor of the first node is connected to the bit line, and each gate of the switching transistors of the second to n-th nodes is connected to a word line, and
    wherein the memory cells of the second to n-th nodes are electrically connected to the first layer.

2. The semiconductor storage device according to claim 1, wherein the memory cell block is three-dimensionally disposed in a direction perpendicular to the semiconductor substrate, and
    wherein a current flows in a perpendicular direction of the memory cell block to operate a memory.

3. The semiconductor storage device according to claim 1, wherein the resistance effect element is made of a phase change material.

4. The semiconductor storage device according to claim 1, wherein a semiconductor thin film configuring the selective transistor and the switching transistor is made of polysilicon.

5. The semiconductor storage device according to claim 1, wherein the selective transistor and the switching transistor are formed of normally-on transistors.

6. The semiconductor storage device according to claim 1, wherein the memory cell has the resistance effect element included in the switching transistor.

7. The semiconductor storage device according to claim 1, wherein the memory cell blocks are formed by a plurality of arrays, or the entire memory cell blocks are of a laminate structure to make a memory storage capacity large.

8. The semiconductor storage device according to claim 1, wherein the first layer is a dopant diffusion layer disposed in vicinity of a surface of the semiconductor substrate.

9. A semiconductor storage device, comprising:
    a semiconductor substrate on which circuits including a peripheral circuit are disposed; and
    a memory cell block having a plurality of memory cells connected in series as one unit, each of the plurality of memory cells having a transistor and a resistance effect element having the core region as a resistor electrically connected in parallel to the transistor, and the transistor including a core disposed columnarly on the semiconductor substrate, an insulating thin film disposed on each side surface of the core through a semiconductor thin film, and a conductive film selectively disposed on a surface of the insulating thin film through the insulating thin film,
    wherein the transistor is formed of a normally-on transistor; and
    wherein the peripheral circuit is disposed in the vicinity of a surface of the semiconductor substrate, and connected to a dopant diffusion layer electrically connected to the memory cell block.

10. The semiconductor storage device according to claim 9, wherein the memory cell block is three-dimensionally disposed in a direction perpendicular to the semiconductor substrate, and
    wherein a current flows in a perpendicular direction of the memory cell block to operate a memory.

11. The semiconductor storage device according to claim 9, wherein the resistance effect element is made of a phase change material.

12. The semiconductor storage device according to claim 9, wherein a semiconductor thin film configuring the selective transistor and the switching transistor is made of polysilicon.

* * * * *